(12) United States Patent
Takeuchi

(10) Patent No.: US 9,172,065 B2
(45) Date of Patent: Oct. 27, 2015

(54) ORGANIC EL DISPLAY PANEL AND METHOD OF MANUFACTURING THE SAME

(71) Applicant: JOLED INC., Tokyo (JP)

(72) Inventor: Takayuki Takeuchi, Hyogo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 14/299,367

(22) Filed: Jun. 9, 2014

(65) Prior Publication Data

US 2014/0284588 A1    Sep. 25, 2014

Related U.S. Application Data

(60) Division of application No. 13/282,769, filed on Oct. 27, 2011, now Pat. No. 8,778,712, which is a continuation of application No. PCT/JP2010/004311, filed on Jun. 30, 2010.

(51) Int. Cl.
| | |
|---|---|
| *H01L 29/08* | (2006.01) |
| *H01L 51/56* | (2006.01) |
| *H01L 27/32* | (2006.01) |
| *H01L 51/00* | (2006.01) |

(52) U.S. Cl.
CPC ............ *H01L 51/56* (2013.01); *H01L 27/3246* (2013.01); *H01L 51/0005* (2013.01)

(58) Field of Classification Search
CPC .................. H01L 2924/0002; H01L 27/3246; H01L 2924/00; H01L 51/56; H01L 27/3244
USPC .......................................................... 257/40
See application file for complete search history.

(56) References Cited

U.S. PATENT DOCUMENTS

| | | |
|---|---|---|
| 5,443,922 A | 8/1995 | Nishizaki et al. |
| 6,784,459 B2 | 8/2004 | Seki et al. |
| 7,932,109 B2 | 4/2011 | Hayata et al. |
| 2002/0064966 A1 | 5/2002 | Seki et al. |

(Continued)

FOREIGN PATENT DOCUMENTS

| | | |
|---|---|---|
| JP | 5-163488 | 6/1993 |
| JP | 2003-241683 | 8/2003 |

(Continued)

OTHER PUBLICATIONS

Japan Office Action, mail date is Mar. 25, 2014.

(Continued)

*Primary Examiner* — Tony Tran
(74) *Attorney, Agent, or Firm* — Greenblum & Bernstein, P.L.C.

(57) ABSTRACT

An organic electroluminescence display panel includes a thin-film transistor layer above a substrate. A planarizing film is above the thin-film transistor layer with contact holes being formed in the planarizing film. A bank is above the planarizing film. The bank includes openings arranged in rows and columns that define regions for forming organic electroluminescence elements. Each opening is between a pair of adjacent concaves in one of the columns. The concaves are formed in an upper surface of the bank and sunken into the contact holes. The upper surface of the bank has repellency. A light-emitting layer is formed in each opening by ejecting drops of an ink from nozzles of an inkjet head into the openings while moving the inkjet head relative to the substrate. The nozzles further eject drops of the ink into the concaves when above the concaves for ejecting the drops of the ink through every nozzle.

12 Claims, 19 Drawing Sheets

(56) References Cited

U.S. PATENT DOCUMENTS

| | | |
|---|---|---|
| 2003/0146710 A1 | 8/2003 | Nakanishi |
| 2004/0056588 A1 | 3/2004 | Nozawa |
| 2004/0166761 A1 | 8/2004 | Seki et al. |
| 2005/0264186 A1 | 12/2005 | Seki et al. |
| 2005/0264187 A1 | 12/2005 | Seki et al. |
| 2005/0266169 A1 | 12/2005 | Seki et al. |
| 2007/0018152 A1 | 1/2007 | Seki et al. |
| 2007/0045616 A1 | 3/2007 | Tokuda et al. |
| 2008/0315760 A1 | 12/2008 | Seki et al. |
| 2009/0009075 A1 | 1/2009 | Seki et al. |
| 2009/0302333 A1 | 12/2009 | Seki et al. |
| 2010/0104740 A1 | 4/2010 | Shinohara |
| 2010/0248405 A1 | 9/2010 | Tanaka |

FOREIGN PATENT DOCUMENTS

| | | |
|---|---|---|
| JP | 2004-095290 | 3/2004 |
| JP | 2004-335351 | 11/2004 |
| JP | 2005-276479 | 10/2005 |
| JP | 2005-322656 | 11/2005 |
| JP | 2007-026970 | 2/2007 |
| JP | 2009-231090 | 10/2009 |
| JP | 2009-245599 | 10/2009 |
| JP | 2010-73602 | 4/2010 |
| JP | 2010-104861 | 5/2010 |

OTHER PUBLICATIONS

International Search Report in PCT/JP2010/004311, mailing date of Aug. 3, 2010.

Direction of movement of head

Solvent dries unevenly

※"Normalized layer thickness" denotes a normalized thickness of a printed layer in a bank, with the thickness of the center of the printed layer regarded as 0 μm.

ORGANIC EL DISPLAY PANEL AND METHOD OF MANUFACTURING THE SAME

CROSS REFERENCE TO RELATED APPLICATION

This application is a divisional of U.S. application Ser. No. 13/282,769, filed on Oct. 27, 2011, which is a continuation application of PCT Application No. PCT/JP2010/004311 filed on Jun. 30, 2010, designating the United States of America, the disclosure of which, including the specification, drawings and claims, is incorporated herein by reference in its entirety.

BACKGROUND OF THE INVENTION

1. Field of the Invention

The present invention relates to an organic electroluminescence (EL) display panel including organic EL elements, which are electric light-emitting elements, and in particular to a technical improvement in an ejection process using an inkjet head.

2. Description of the Related Art

Organic EL elements, which have come into practical use in recent years, are current-driven light-emitting elements. Each organic EL element has the following basic structure. A light-emitting layer that includes an organic light-emitting material is disposed between a pair of electrodes, i.e., an anode and a cathode. When driven, voltage is impressed between the pair of electrodes, and holes injected into the light-emitting layer from the anode recombine with electrons injected into the light-emitting layer from the cathode. Each organic EL element makes use of the phenomenon of electroluminescence occurring during this recombination. Since each organic EL element emits light, the light from the organic EL display panel is highly visible. Furthermore, each organic EL element is a complete solid state device and thus has excellent impact resistance and the like.

Among different types of organic EL elements, one known type of organic EL element contains a light-emitting layer and a charge injection layer formed by ejecting ink containing a macromolecule material or small molecules that are suitable for thin-film formation in a wet process (ejection process) of, for example, an inkjet method. This type of organic EL element is called an ejection-type organic EL element. There are organic EL display panels that include, as units of light emission, a plurality of such ejection-type organic EL elements arranged in a matrix on a substrate. Such organic EL display panels have been commercialized as displays in small electronic devices, image display devices, and the like.

In a typical inkjet method (see Patent Literature 1), the substrate on which ink is to be ejected (hereinafter, "ejection target substrate") is first placed on a work table. While the inkjet head is moved across the substrate in one of row and column directions, drops of ink are ejected through nozzles into the regions for forming the organic EL elements as defined by a bank on the substrate. Herein, the ink is a solution containing an organic material for the light-emitting layer or charge injection layer, as well as solvent. The inkjet head is driven by a driving method such as a piezoelectric method. The bank takes many shapes. One example is a line bank whose shape corresponds to a plurality of regions for forming the organic EL elements. However, a commonly-used example is a pixel bank that positionally defines each individual organic EL element.

When manufacturing an organic EL panel with a plurality of organic EL elements arranged therein, it is necessary to ensure that the characteristics of the organic EL elements are uniform. Therefore, it is required to eject a uniform amount of ink into each of the regions for forming the organic EL elements, so as to ensure that the light-emitting layer and the charge injection layer, which are formed by drying the ejected ink by evaporation, have a uniform thickness in each of the regions for forming the organic EL elements. For this reason, voltage applied to each nozzle is normally adjusted in the ejection process so that each nozzle ejects the ink at a constant speed (hereinafter, "ink ejection speed"). This method is employed to eject a uniform amount of ink into each of the regions for forming the organic EL elements on the substrate.

CITATION LIST

[Patent Literature 1] JP Patent Application Publication No. 2003-241683.
[Patent Literature 2] JP Patent Application Publication No. 2005-322656.

SUMMARY OF THE INVENTION

There are several problems in manufacturing organic EL display panels using a conventional inkjet method.

The first problem is that uniformity in the thickness of each layer formed by the ejected ink hardly meets the required standard.

FIGS. 19A and 19B are cross-sectional views each schematically showing a manufacturing process for a conventional organic EL display panel. On a surface of a substrate 1, a TFT layer 2, a planarizing film 4, a lower electrode 6, and a bank 7 are disposed in the stated order. The bank 7 is disposed so as to form substantially rectangular openings 13 whose longitudinal directions lie in a column (Y) direction. Drops of ink are ejected through nozzles provided in a head unit 301 of an inkjet head into the regions for forming the organic EL elements, namely, the openings 13. A large part of solvent components contained in the ejected ink 9x dries by evaporation and the vaporized solvent components proceed straight above the ejected ink 9x. However, a portion of the bank 7 exists between any pair of openings 13 adjacent in the column (Y) direction. Here, a relatively large distance separates any pair of openings 13 adjacent in the column (Y) direction. Accordingly, the degree at which the vaporized solvent components of the ejected ink 9x freely diffuse is relatively large around both edges of each opening 13 in the column (Y) direction. Accordingly, the concentration of the vaporized solvent components is higher around both edge regions of each opening 13 in the column (Y) direction than around a central region of each opening 13. As a result, in each opening 13, the layer formed by the ejected ink 9x is thicker in both edge regions of the opening 13 in the column (Y) direction than in the central region of the opening 13. That is to say, the layers formed by the ejected ink 9x do not have a uniform thickness overall. FIG. 20 shows a normalized result of measuring the thickness of a conventional light-emitting layer. As apparent from FIG. 20, the thickness of a light-emitting layer 9 is large in both edge regions thereof in a longitudinal direction. In other words, the thickness of the light-emitting layer 9 is not uniform.

The second problem is clogging of the nozzles in the inkjet head.

The ink that is filled in the inkjet head to manufacture the organic EL display panel has higher viscosity than the printing ink generally used in inkjet printers. In a case where such ink having high viscosity is used, if certain nozzles that do not correspond to any of the regions for forming the organic EL elements are set not to eject the ink (see FIG. 19A), then the ink may solidify inside the certain nozzles. As a result, the certain nozzles may be clogged. When there are clogged nozzles, drops of ink cannot be ejected properly during a specified period of time. On the other hand, in a case where drops of ink are ejected into each opening through a plurality of nozzles, if one or more of the plurality of nozzles are clogged, then a layer formed by the ejected ink does not have a uniform thickness in each of the regions for forming the organic EL elements. This could lead to unevenness in light emission. Moreover, in a case where drops of ink are ejected into each opening through a single nozzle, if the nozzle is clogged, then the drops of ink cannot be ejected into any of the openings aligned in a scanning direction of the inkjet head.

Clogged nozzles, which cannot respond to changes made to the printing pattern on the substrate, could result in substrate losses and replacement of the inkjet head in the worst case. Even if there is a possibility of recovering the clogged nozzles, a user has to go to the trouble of detaching the inkjet head from the device, cleaning the inkjet head, and then attaching the inkjet head back to the device while maintaining alignment of the inkjet head with high accuracy (this attachment necessitates a recovery operation as well). This could significantly reduce production efficiency.

The present invention has been conceived in view of the above problems. The first aim of the present invention is to provide (i) an organic EL display panel that contains layers formed by an inkjet method with a uniform thickness, suppresses unevenness in light emission, and achieves excellent image display performance, and (ii) a method of manufacturing such an organic EL display panel.

The second aim of the present invention is to provide a method of manufacturing an organic EL display panel that can prevent clogging of nozzles in an inkjet head with favorable production efficiency.

In order to solve the above problems, one aspect of the present invention is a method of manufacturing an organic EL display panel, comprising the steps of: (A) preparing a substrate; (B) forming a TFT layer on the substrate; (C) forming a planarizing film above the TFT layer; (D) forming a bank above the planarizing film, the bank having repellency at least on a surface thereof and including a plurality of openings and a plurality of concaves in such a manner that the openings are arranged in row and column directions and define, in one-to-one correspondence, regions for forming respective organic EL elements, each concave being formed in an upper surface of a portion of the bank so that each opening is sandwiched between a corresponding pair of the concaves adjacent in the column direction; and (E) forming a light-emitting layer in each opening by (i) ejecting drops of first ink containing an organic material and a solvent into each opening through a predetermined number of nozzles among a plurality of nozzles disposed in an inkjet head, and (ii) causing the solvent contained in the ejected drops of first ink to dry by evaporation. Here, in step (E), any of the plurality of nozzles ejects the drops of first ink into one of the concaves when positioned above the one of the concaves.

According to the method of manufacturing the organic EL display panel pertaining to the present invention, concaves are formed in an upper surface of the bank in such a manner that along the column direction, each opening is sandwiched between a corresponding pair of adjacent concaves on the substrate. Furthermore, in steps (D) and (E), drops of first ink containing an organic material (material of the light-emitting layer) and a solvent are ejected into each concave. When the solvent in the drops of first ink that have been ejected into the concaves and openings has evaporated, the concentration of the vaporized solvent becomes uniform as compared with conventional cases, especially around both edges of each opening in the column direction. By drying the solvent in such an atmosphere with a uniform concentration of the vaporized solvent, the resultant light-emitting layers mostly have a uniform thickness. Hence, the organic EL display panel, as a whole, hardly brings about unevenness in light emission and therefore can achieve excellent image display performance.

Furthermore, in steps (D) and (E), the drops of first ink are ejected into (i) each column of openings through a predetermined number of nozzles among a plurality of nozzles disposed in an inkjet head, and (ii) each column of concaves through the rest of the plurality of nozzles other than the predetermined number of nozzles. Therefore, unlike conventional cases, the drops of first ink are ejected through every single nozzle. As described above, the concaves on the substrate are used by the nozzles for dummy ejection. That is, every single nozzle ejects the drops of first ink. This can alleviate the problem of clogging of the nozzles in the inkjet head, and allows manufacturing the organic EL display panel with favorable production efficiency.

DESCRIPTION OF THE PREFERRED EMBODIMENT(S)

Figure 1:
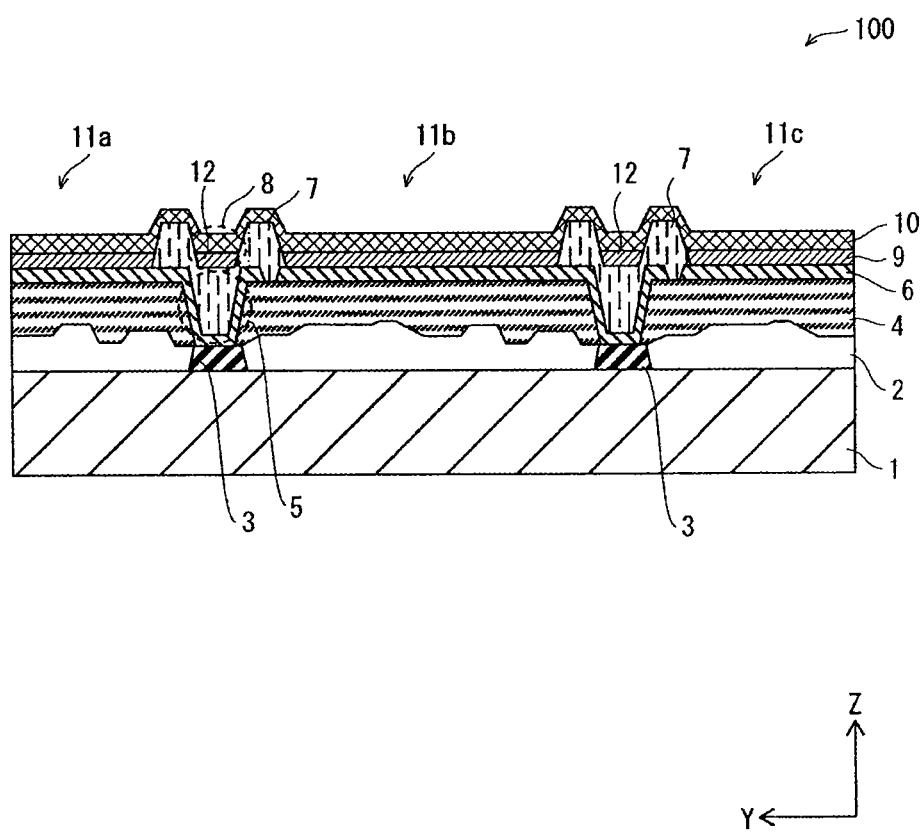
FIG. 1 is a schematic cross-sectional view showing the structure of an organic EL display panel pertaining to Embodiment 1.

One aspect of the present invention is a method of manufacturing an organic EL display panel, comprising the steps of: (A) preparing a substrate; (B) forming a TFT layer on the substrate; (C) forming a planarizing film above the TFT layer; (D) forming a bank above the planarizing film, the bank having repellency at least on a surface thereof and including a plurality of openings and a plurality of concaves in such a manner that the openings are arranged in row and column directions and define, in one-to-one correspondence, regions for forming respective organic EL elements, each concave being formed in an upper surface of a portion of the bank so that each opening is sandwiched between a corresponding pair of the concaves adjacent in the column direction; and (E) forming a light-emitting layer in each opening by (i) ejecting drops of first ink containing an organic material and a solvent into each opening through a predetermined number of nozzles among a plurality of nozzles disposed in an inkjet head, and (ii) causing the solvent contained in the ejected drops of first ink to dry by evaporation. Here, in step (E), any of the plurality of nozzles ejects the drops of first ink into one of the concaves when positioned above the one of the concaves.

According to the present invention as described above, the concaves are provided in such a manner that each opening is sandwiched between a corresponding pair of concaves adjacent along the column direction. After drops of first ink containing a predetermined organic material and a solvent are ejected into each opening and each concave, the solvent is cause to dry by evaporation. Consequently, the concentration of the vaporized solvent becomes uniform around both edges of each opening in the column direction. Hence, once the solvent has dried, the light-emitting layer having a uniform thickness is formed in each opening. With use of organic EL elements having uniform light-emitting characteristics, the resultant manufactured organic EL display panel is expected to hardly bring about unevenness in light emission and therefore to achieve excellent image display performance.

Furthermore, on the substrate, the drops of first ink are ejected through the nozzles in the inkjet head into (i) each opening, which is sandwiched between a corresponding pair of concaves adjacent along the column direction, and (ii) each concave, which is formed on the upper surface of the bank. In other words, every nozzle ejects the drops of first ink unlike conventional cases. As described above, the nozzles eject the drops of first ink into the concaves on the substrate in the form of dummy ejection. This can alleviate the problem of clogging of the nozzles in the inkjet head, and allows manufacturing the organic EL display panel with favorable production efficiency.

In another aspect of the present invention, in step (D), the bank and the concaves may be formed simultaneously. This method allows efficiently forming the concaves in accordance with the patterning of the bank, and is therefore advantageous in terms of manufacturing efficiency.

Another aspect of the present invention is a method of manufacturing an organic EL display panel, comprising the steps of: (A) preparing a substrate; (B) forming a TFT layer on the substrate; (C) forming a planarizing film above the TFT layer; (D) forming, in the planarizing film, a plurality of contact holes via which an electrode layer above the planarizing film comes in contact with the TFT layer; (E) forming a bank above the planarizing film, the bank having repellency at least on a surface thereof and including a plurality of openings and a plurality of concaves in such a manner that (i) the openings are arranged in row and column directions and define, in one-to-one correspondence, regions for forming respective organic EL elements, and (ii) each opening is sandwiched between a corresponding pair of the contact holes adjacent in the column direction, each concave being formed in an upper surface of a portion of the bank as a result of the portion of the bank sinking into a corresponding one of the contact holes; and (F) forming a light-emitting layer in each opening by (i) ejecting drops of first ink containing an organic material and a solvent into each opening through a predetermined number of nozzles among a plurality of nozzles disposed in an inkjet head, and (ii) causing the solvent contained in the ejected drops of first ink to dry by evaporation. Here, in step (F), any of the plurality of nozzles ejects the drops of first ink into one of the concaves when positioned above the one of the concaves.

In the above method, the concaves are formed in accordance with the shapes of the contact holes. Due to such concaves that have been formed by taking advantage of the shape of the existing substrate, there is no necessity to provide the substrate with additional holes and dents to prevent the clogging of the nozzles. Hence, the above method makes the viability of the present invention high, and is advantageous especially in terms of cost and manufacturing efficiency.

Furthermore, by utilizing such concaves formed by taking advantage of the shapes of the contact holes, the concentration of the vaporized solvent becomes uniform along the column direction in each opening. This makes it possible to form the light-emitting layer having a uniform thickness. Moreover, the drops of first ink are ejected through the nozzles into each concave. Accordingly, every nozzle in the inkjet head ejects the drops of first ink. This prevents the problem of the clogging of the nozzles.

In another aspect of the present invention, steps (C) and (D) may be performed simultaneously in the above case. The above method allows forming the contact holes in accordance with the patterning of the planarizing film, and is therefore advantageous in terms of manufacturing efficiency.

In another aspect of the present invention, the above method may further comprise, between steps (D) and (E), a step of forming the electrode layer above the planarizing film. Since the concaves are formed in the upper surface of the bank, the electrode layer can be formed in the same manner as in the conventional cases.

In another aspect of the present invention, a total amount of the drops of first ink ejected into each concave may be smaller than a total amount of the drops of first ink ejected into each opening. The above ingenious setting can eliminate wasteful use of first ink to be ejected into the concaves, prevent a cost increase due to loss of drops of first ink, and prevent the possibility of the first ink ejected into the concaves from overflowing into the openings.

In another aspect of the present invention, the following setting may be performed as a method of controlling a total amount of drops of first ink: the number of times the drops of first ink are ejected into each concave is set to be smaller than the number of times the drops of first ink are ejected into each opening. In this case, the number of times the drops of first ink are ejected into each concave and each opening can be adjusted by changing the frequency of a pulse voltage applied to the inkjet head.

Alternatively, in another aspect of the present invention, a per-drop volume of the drops of first ink ejected into each concave may be smaller than a per-drop volume of the drops of first ink ejected into each opening. In this case, the per-drop volume of the drops of first ink ejected into each concave and each opening can be adjusted by changing the voltage applied to each nozzle in the inkjet head.

In another aspect of the present invention, the above method may further comprise, between steps (E) and (F), a step of forming a charge transport layer in each opening by (i) ejecting drops of second ink containing an organic material and a solvent into each opening through the predetermined number of nozzles, and (ii) causing the solvent contained in the ejected drops of second ink to dry by evaporation. Here, in the step of forming the charge transport layer, any of the plurality of nozzles may eject the drops of second ink into one of the concaves when positioned above the one of the concaves. According to the above aspect, the charge transport layer is formed by (i) ejecting drops of second ink containing an organic material and a solvent into each opening and each concave, and (ii) causing the solvent in the ejected drops of second ink to dry by evaporation. In the above aspect, it is possible to make the concentration of the vaporized solvent uniform in each opening along the column direction, and therefore to form the charge transport layer having a uniform thickness. The resultant organic EL display panel is expected to achieve excellent image display performance.

In another aspect of the present invention, ink ejection may be performed by the following method: the inkjet head is positioned so that the plurality of nozzles therein are arranged in correspondence with each column of the openings, and the ejection is performed with respect to each of the openings arranged in the row and column directions while moving the inkjet head in the row direction.

In this case, the drops of first ink can be ejected into each concave positioned between a corresponding pair of openings adjacent in the column direction. In other words, every nozzle in the inkjet head is set to eject the drops of first ink. Consequently, clogging of the nozzles can be prevented effectively.

In this case, as another aspect of the present invention, a longitudinal direction of the inkjet head and the column direction may form a predetermined angle when viewed in a direction perpendicular to an upper surface of the bank, so that a group of nozzles among the plurality of nozzles, which is other than the predetermined number of nozzles, passes over the concaves while moving in the row direction. By positioning the inkjet head in the above manner, the drops of first ink can be reliably ejected into each concave.

In another aspect of the present invention, in step (F), the drops of first ink may be ejected from the inkjet head that is positioned in such a manner that the longitudinal direction thereof and the column direction form the predetermined angle when viewed in the direction perpendicular to the upper surface of the bank. This way, the pitch between any pair of nozzles in the inkjet head is accurately adjusted with respect to the openings and concaves on the substrate.

In another aspect of the present invention, the inkjet head may be positioned so that the plurality of nozzles therein are arranged in one-to-one correspondence with columns of the openings, and the ejection may be performed with respect to each of the openings arranged in the row and column directions while moving the inkjet head in the column direction. In this aspect also; the drops of first ink are ejected into each opening and each concave that is positioned between a corresponding pair of openings adjacent in the column direction. As a result, the concentration of the vaporized solvent becomes uneven, and the light-emitting layer has a uniform thickness.

In another aspect of the present invention, a value of a depth of each concave may be the same as, or in a range of 100% to 95% of, a value of a height of the bank.

Alternatively, in another aspect of the present invention, a value of a depth of each concave may be greater than a value of a height of the bank and smaller than a value of a depth of each contact hole.

As described above, the depth of each concave can be arbitrarily set to a certain extent. By combining this setting of the depth of each concave with the setting of the inkjet head, the amount of the first ink to be ejected into each concave can be adjusted.

Another aspect of the present invention is an organic EL display panel comprising: a substrate; a TFT layer provided on the substrate; and a planarizing film provided above the TFT layer. In the organic EL display panel, a bank is provided above the planarizing film, the bank having repellency at least on a surface thereof and including a plurality of openings in such a manner that the openings are arranged in row and column directions and define, in one-to-one correspondence, regions for forming respective organic EL elements. A plurality of concaves are each provided in an upper surface of a portion of the bank so that each opening is sandwiched between a corresponding pair of the concaves adjacent in the column direction. A layer is formed in each of the openings and the concaves by (i) ejecting drops of ink containing an organic material and a solvent into each of the openings and the concaves through a plurality of nozzles of an inkjet, and (ii) causing the solvent contained in the ejected drops of ink to dry by evaporation. The layer disposed in each opening is a light-emitting layer. With the above structure, when the solvent in the ejected drops of ink dries by evaporation, the concentration of the vaporized solvent becomes uniform especially around both edges of each opening along the column direction. Accordingly, the light-emitting layer having a uniform thickness is formed in each opening. As a result, organic EL elements having uniform light-emitting characteristics are formed. The resultant organic EL display panel hardly brings about unevenness in light emission, and therefore achieves excellent image display performance.

Another aspect of the present invention is an organic EL display panel comprising: a substrate; a TFT layer provided on the substrate; a planarizing film provided above the TFT layer; and an electrode layer provided above the planarizing film. In the organic EL display panel, the electrode layer is electrically connected to the TFT layer via a plurality of contact holes provided in the planarizing film. A bank is provided above the electrode layer, the bank having repellency at least on a surface thereof and including a plurality of openings and a plurality of concaves in such a manner that the openings are arranged in row and column directions and define, in one-to-one correspondence, regions for forming respective organic EL elements, each concave being provided in an upper surface of a portion of the bank as a result of the portion of the bank sinking into a corresponding one of the contact holes. In each of the openings and the concaves, a layer containing the same organic material is disposed. The layer disposed in each opening is a light-emitting layer.

With the above structure, when the solvent in the ejected drops of ink dries by evaporation, the concentration of the vaporized solvent becomes uniform especially around both edges of each opening along the column direction. Accordingly, the light-emitting layer having a uniform thickness is formed in each opening. As a result, organic EL elements having uniform light-emitting characteristics are formed. The resultant organic EL display panel hardly brings about unevenness in light emission, and therefore achieves excellent image display performance. In addition, the concaves are formed in accordance the shapes of the contact holes formed on the substrate. This structure therefore does not require formation of additional holes and dents for dummy ejection by the inkjet head. Accordingly, the above organic EL display panel can be implemented at relatively low cost and is advantageous in terms of viability.

Embodiment 1

Structure of Organic EL Display Panel 100

FIG. 1 is a cross-sectional view schematically showing the structure of an organic EL display panel 100 pertaining to Embodiment 1 of the present invention.

The organic EL display panel 100 shown in FIG. 1 includes, as subpixels (light-emitting pixels), organic EL elements 11*a*, 11*b* and 11*c* each having a light-emitting layer 9 corresponding to one of the following colors: R, G, and B. A combination of the three subpixels 11*a*, 11*b* and 11*c* constitutes one pixel. The organic EL elements 11*a*, 11*b* and 11*c* are adjacently arranged on an entirety of the organic EL display panel 100 in row (X) and column (Y) directions, i.e., in a matrix.

It goes without saying that the organic EL elements 11*a*, 11*b* and 11*c* may be configured to emit light of the same color.

On one main surface of a TFT substrate 1 (hereinafter, simply "substrate 1"), a TFT wiring portion (TFT layer 2), a planarizing film 4, and a lower electrode 6 are layered in this order.

A bank 7 is formed on the lower electrode 6 to define regions (openings 13) for forming the organic EL elements. In each of the openings 13, a light-emitting layer 9 and an upper electrode (cathode) 10 are layered in this order.

The substrate 1 forms the base of the organic EL display panel 100 and may be formed with one of insulating materials such as alkali-free glass, soda glass, nonfluorescent glass, phosphate glass, borate glass, quartz, acrylic resin, styrenic resin, polycarbonate resin, epoxy resin, polyethylene, polyester, silicone resin, alumina, and the like.

On the stated one main surface of the substrate 1, the TFT wiring portion (TFT layer 2) is formed to drive each of the organic EL elements 11*a*, 11*b* and 11*c* arranged on the entirety of the organic EL display panel 100 by an active matrix method. A surface of the TFT layer 2 is covered by an organic material (planarizing film 4) with excellent insulating properties. A hole (contact hole 5) having a circular bottom is formed by creating an opening extending along a thickness direction (Z direction) in a portion of the planarizing film 4 between every pair of openings 13 adjacent in the column (Y) direction. The lower electrode 6 in each contact hole 5 is connected to the TFT layer 2 via a power supply electrode 3.

The lower electrode 6 is an anode and may be made of, for example, silver (Ag), APC (alloy of silver, palladium and copper), ARA (alloy of silver, rubidium and gold), MoCr (alloy of molybdenum and chromium), or NiCr (alloy of nickel and chromium). When the organic EL elements 11*a*, 11*b* and 11*c* are of a top-emission type, the lower electrode 6 is preferably made of a light-reflective material.

The bank 7 is formed from an organic material with insulating properties (e.g., acrylic resin, polyimide resin, and novolac-type phenolic resin), and at least the surface thereof is provided with repellency. In terms of the pattern, the bank 7 is formed based on a photolithography method or the like, so as to surround each of the regions (openings 13) for forming the organic EL elements. Most portions of the bank 7 have a trapezoid cross-section in an XY-plane or a YZ-plane. However, portions of the bank 7 corresponding to the contact holes 5 have sunk due to shrinking of the material of the bank 7. As a result, a concave 8 is formed in each of upper surfaces of the portions of the bank 7 that correspond to the contact holes 5.

The light-emitting layers 9 are formed on the surface of the lower electrode 6. Each of the light-emitting layers 9 corresponds to one of the following colors: R, G, and B. The light-emitting layers 9 contain a predetermined organic material. A commonly-known material may be used for the light-emitting layers 9. Examples of the material for the light-emitting layers 9 include a fluorescent material such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, anthracene compound, cyanine compound, acridine compound, metal complex of an 8-hydroxyquinoline compound, metal complex of a 2-bipyridine compound, complex of a Schiff base and a group three metal, metal complex of oxine, rare earth metal complex, etc., as recited in Japanese Patent Application Publication No. H5-163488.

In the organic EL display panel 100, organic layers 12 are provided in the concaves 8 of the bank 7. The organic layers 12 are formed by drying the solvent of ink ejected into the concaves 8 by evaporation, the ink being made of the same material as the light-emitting layers 9. The organic layers 12 do not particularly exert notable functions after manufacturing of the organic EL display panel 100. However, as will be described later in detail, the organic layers 12 and the light-emitting layers 9 are formed simultaneously during a wet process of the inkjet method, by ejecting ink into both of the concaves 8 and the openings 13.

The upper electrode 10 is a cathode and is formed from ITO, indium zinc oxide (IZO), or the like. When the organic EL elements 11*a*, 11*b* and 11*c* are of a top-emission type, the upper electrode 10 is preferably formed from a transparent material.

Although not illustrated in FIG. 1, a commonly-known passivation layer is provided on the upper electrode 10. The passivation layer is formed from a material such as silicon nitride (SiN) and silicon oxynitride (SiON), and prevents the light-emitting layers 9 from deteriorating as a result of coming into contact with moisture, the air, and the like. When the organic EL elements 11*a*, 11*b* and 11*c* are of a top-emission type, the passivation layer is preferably formed from a transparent material.

In the organic EL display panel 100 having the above-described structure, the light-emitting layers 9 that are constituent elements of the organic EL elements 11*a*, 11*b* and 11*c*, as well as the organic layers 12 in the concaves 8, are formed by ejecting ink containing an organic material and a solvent in the same process of the inkjet method, and then drying solvent components of the ejected ink by evaporation. By causing evaporation of the solvent components of the ink ejected into both of the openings 13 and the concaves 8, the degree at which the vaporized solvent components freely diffuse around both edges of each opening 13 in the column (Y) direction is reduced as compared with conventional cases. This makes the concentration of the vaporized solvent components uniform. Due to this effect, each of the light-emitting layers 9 in the organic EL elements 11a, 11b and 11c has an extremely uniform thickness, and various types of unevenness in light emission (e.g., unevenness in the row and column directions and unevenness across the surface) are suppressed. Consequently, the organic EL display panel 100, in which the plurality of organic EL elements 11a, 11b and 11c are arranged, can achieve excellent image display performance as compared with conventional cases.

Due to ejection of the ink into the concaves 8, Embodiment 1 can also achieve the effect of preventing clogging of nozzles in the inkjet head used in the manufacturing process. The following describes one example of a method of manufacturing the organic EL display panel pertaining to the prevent invention, along with the above effects.

Method of Manufacturing Organic EL Display Panel 100

A description is now given of a method of manufacturing the organic EL display panel 100 as a whole. After that, the wet process of the manufacturing method will be discussed in detail.

Figure 4A:
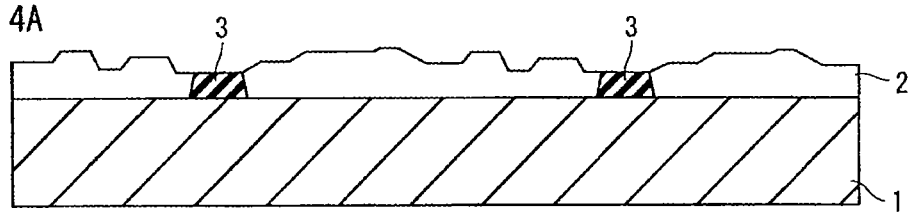
FIGS. 4A to 4D illustrate a manufacturing process for an organic EL display panel.

The substrate 1 is prepared and placed in the chamber of a sputtering apparatus for film formation. A predetermined sputter gas is introduced into the chamber, and via reactive sputtering, the TFT layer 2 and the power supply electrodes 3 are formed (FIG. 4A).

Figure 4B:
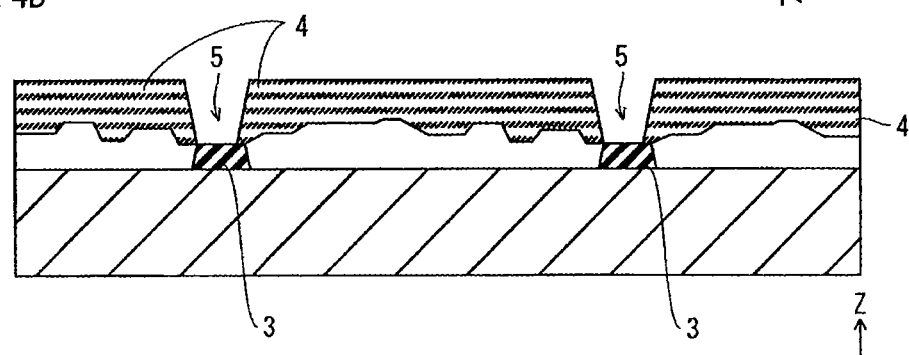

Thereafter, in accordance with a photoresist method, the planarizing film 4 having a thickness of approximately 4 μm is formed on the TFT layer 2 and the power supply electrodes 3 (FIG. 4B). Here, the planarizing film 4 is made of a commonly-known organic material with excellent insulating properties. At this time, the contact holes 5 are formed which eventually establish electrical connection between the lower electrode 6 to be formed on the planarizing film 4 and the power supply electrodes 3. Here, each contact hole 5 is formed so as to be positioned between a corresponding pair of openings 13 adjacent in the column (Y) direction. By using the photoresist method in combination with a desirable pattern mask, the planarizing film 4 and the contact holes 5 can be formed simultaneously. It goes without saying that the contact holes 5 are not limited to being formed in accordance with the above-described method. For example, the contact holes 5 may be formed by, after uniformly forming the planarizing film 4, removing portions of the planarizing film 4 at predetermined positions.

Figure 4C:
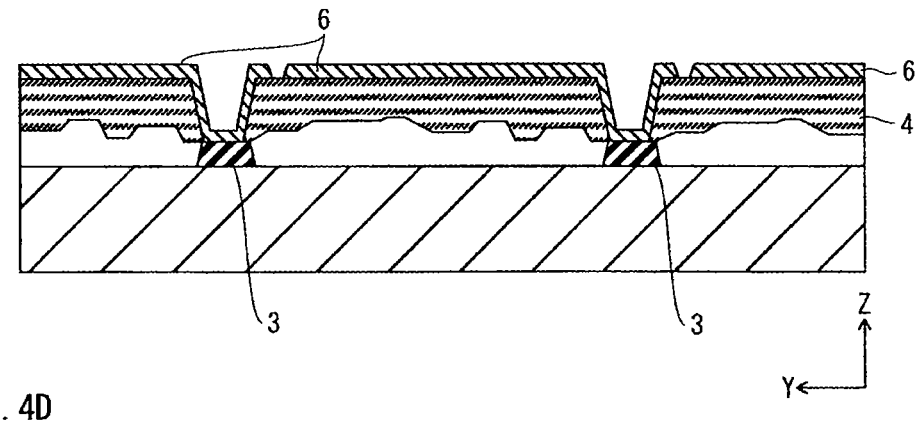

Thereafter, in accordance with a vacuum deposition method or a sputtering method, the lower electrode 6 is formed on the planarizing film 4 in a predetermined pattern (e.g., in correspondence with each of the regions for forming the organic EL elements) so as to be electrically connected to the power supply electrodes 3 (FIG. 4C). Here, the lower electrode 6 is made of a metal material having a thickness of approximately 50 nm.

Next, a hole-injection layer 4 is formed via reactive sputtering. More specifically, a metal material such as molybdenum and tungsten is used as a sputtering target on which the sputtering is performed, and an argon gas and an oxygen gas are introduced into the chamber as a sputter gas and a reactive gas, respectively. As a result, the hole-injection layer 4 made of an oxide of molybdenum, tungsten, or the like is formed.

Figure 4D:
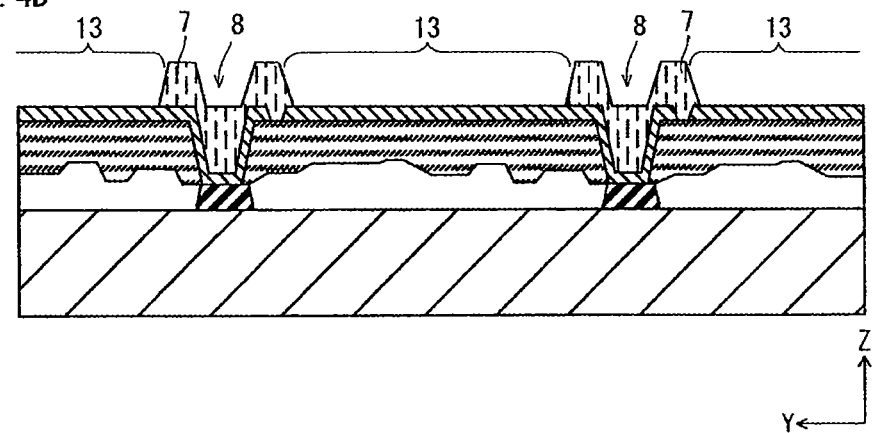

Next, a resist material is prepared as a bank material, and the bank 7 and the concaves 8 are formed in accordance with the photoresist method. Examples of the resist material include a photosensitive resist material and a resist material including fluororesin material or acrylic resin material. To be more specific, after the bank material is uniformly applied on the lower electrode 6, a photoresist is applied on the lower electrode 6. Then, on the photoresist, a mask shaped into the pattern of the bank 7 is overlaid. A commonly-known halftone mask may be used as the above mask. Next, the photoresist on which the mask is overlaid is exposed to light. As a result, a resist pattern is formed. Subsequently, an excess bank material and a non-hardened photoresist are washed off with an aqueous or non-aqueous etchant (release agent), which completes the patterning of the bank material. After that, the residual photoresist on the patterned bank material is removed by washing with pure water. The above processes complete the bank 7 that has (i) the openings 13 in the respective regions for forming the organic EL elements, (ii) the concaves 8 in upper surfaces of portions of the bank 7 that are each positioned between a corresponding pair of openings 13 adjacent in the column (Y) direction, and (ii) at least repellency on the surface thereof (FIG. 4D). In a case where the contact holes 5 are formed as in the present Embodiment 1, the concaves 8 are formed in the course of nature due to the bank material sinking into the contact holes 5. It is therefore unnecessary to perform a separate process of forming the concaves 8. Hence, the above processes are advantageous in terms of production cost and manufacturing efficiency.

Figure 2:
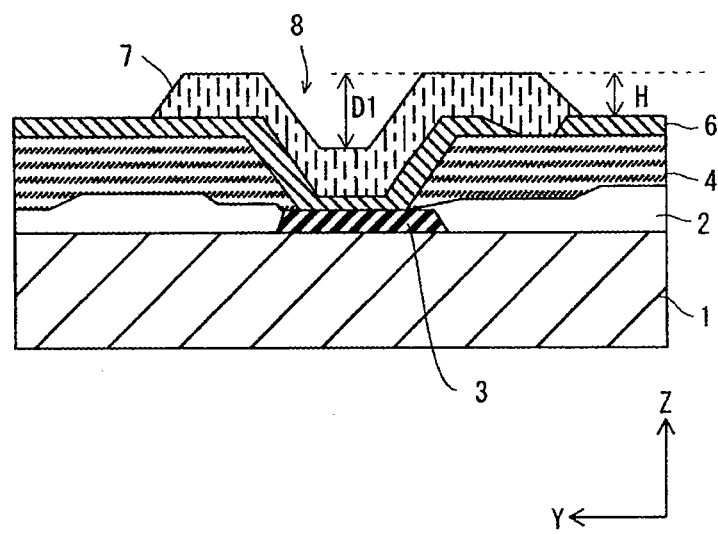
FIG. 2 is an enlarged schematic cross-sectional view showing the structure around a concave.

Note that as shown in the enlarged cross-sectional view of FIG. 2, the depth D1 of each concave 8 is preferably larger than the height H of the bank 7. This design allows ejecting an abundant amount of ink into each concave 8 and thus maintaining uniformity in the concentration of solvent evaporated from the ink for a relatively long period of time.

Figure 3:
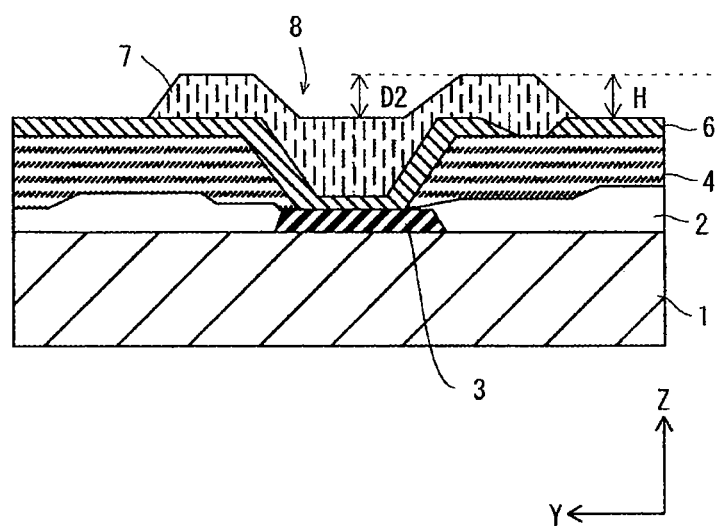
FIG. 3 is an enlarged schematic cross-sectional view showing the structure around a concave.

Alternatively, as shown in the enlarged cross-sectional view of FIG. 3, the depth D2 of each concave 8 may be the same as the height H of the bank 7, or may be in a range of 100% to 95% of the height H in consideration of precision errors. When the depth D2 is relatively small as in the structure of FIG. 3, the time period during which the solvent evaporates from the ink in each concave 8 can be shortened as compared with the structure of FIG. 2.

It goes without saying that the depth of each concaves 8 may be far smaller than the height of the bank 7. No matter how deep each concave 8 is, the depth thereof can be set by, for example, selecting a proper bank material from among commonly-known materials.

Note that during this process of forming the bank 7, the surface of the bank 7 may be treated with an alkaline solution, water, or an organic solvent, or by plasma treatment, in order to adjust the angle of contact between the bank 7 and the ink to be ejected into the openings 13, or to provide at least the surface of the bank 7 with repellency.

Figure 8E:
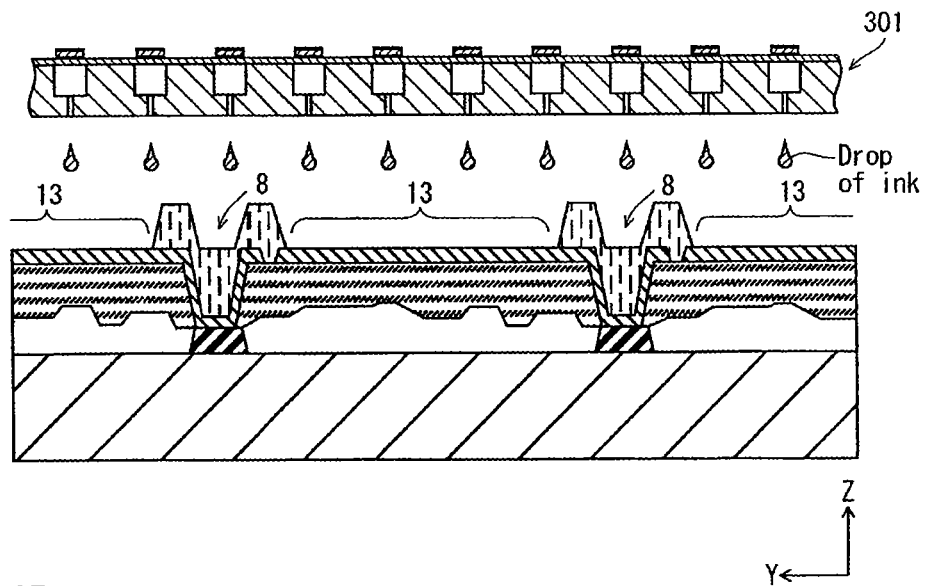
FIGS. 8E to 8G illustrate a manufacturing process for an organic EL display panel.

Next, the ink is prepared by mixing materials of the light-emitting layers, namely an organic material and a solvent, at a predetermined ratio. This ink is supplied to an inkjet head 30 of an inkjet device system 1000, which will be described later. In accordance with a wet process of a commonly-known inkjet method, the ink is ejected into each of the openings 13 and concaves 8 (FIG. 8E).

Figure 8F:
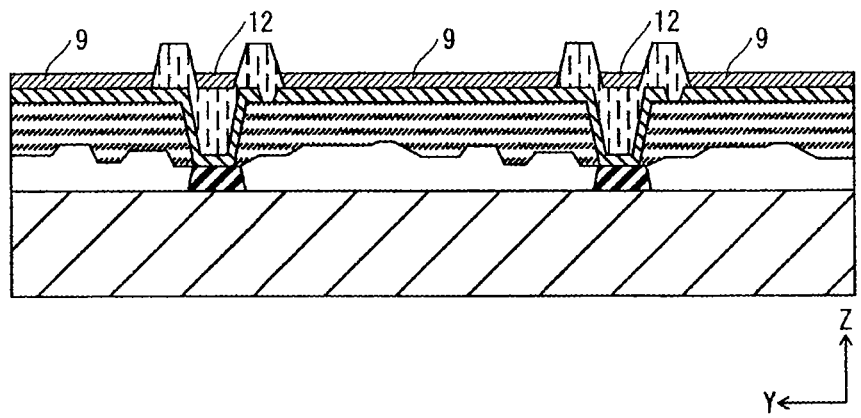
Figure 11:
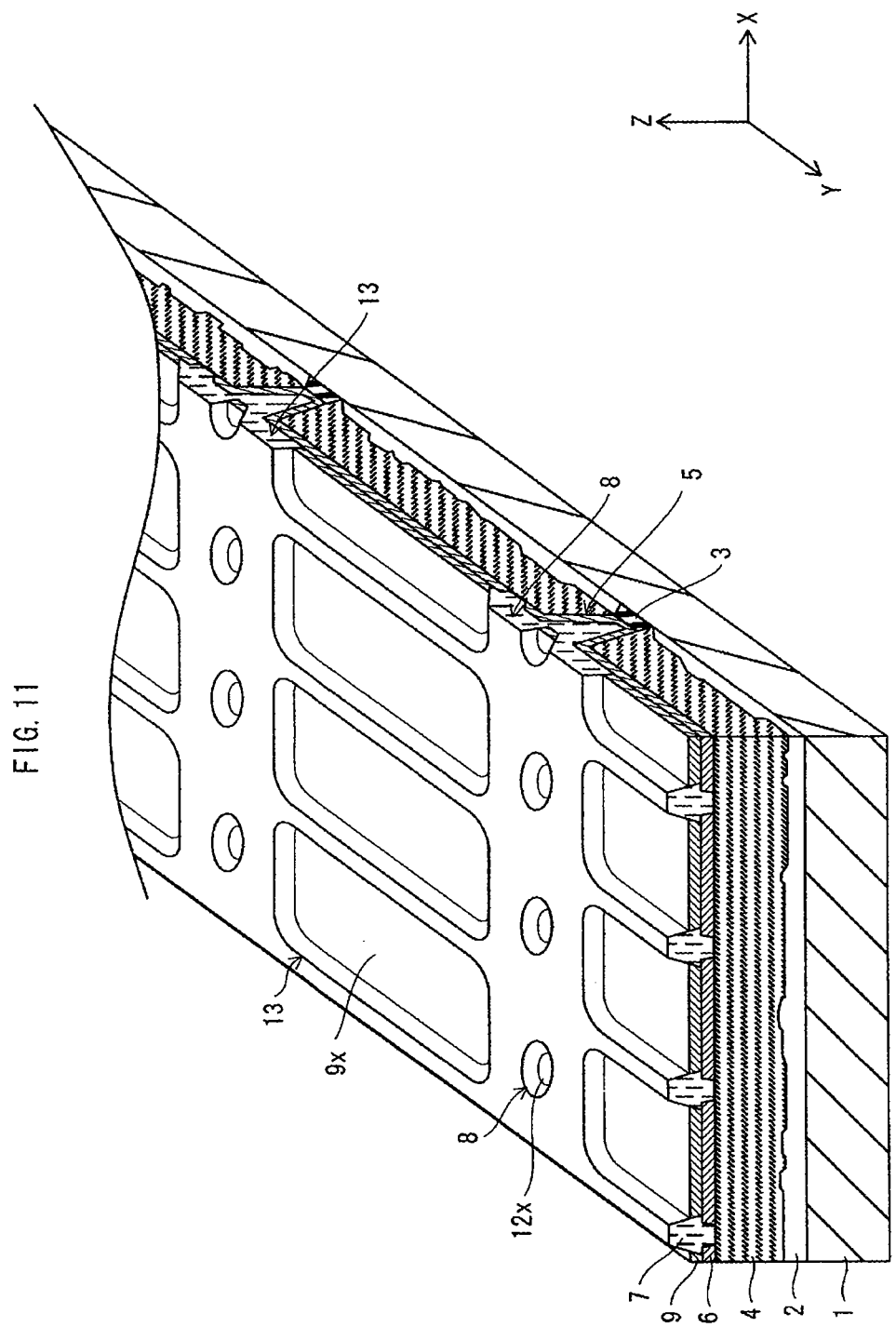
FIG. 11 is a cross-sectional perspective view showing the organic EL display panel immediately after the ink ejection.

FIG. 11 is a perspective view showing a part of the organic EL display panel 100 immediately after the ink is ejected onto the substrate in accordance with the wet process. After the bank 7 is formed on the substrate with the openings 13 provided in the row (X) and column (Y) directions in a two-dimensional pattern, and with the concaves 8 each provided between a corresponding pair of openings 13 adjacent in the column (Y) direction, drops of ink are ejected into each of the openings 13 and concaves 8. Consequently, ink puddles 9x and 12x are formed as illustrated in FIG. 11. The ink puddles 9x and 12x are the summation of drops of ink ejected into the respective openings 13 and concaves 8 at high speed. The light-emitting layers 9 and the organic layers 12 are formed by drying solvent in the ink puddles 9x and 12x by evaporation (FIG. 8F).

Figure 8G:
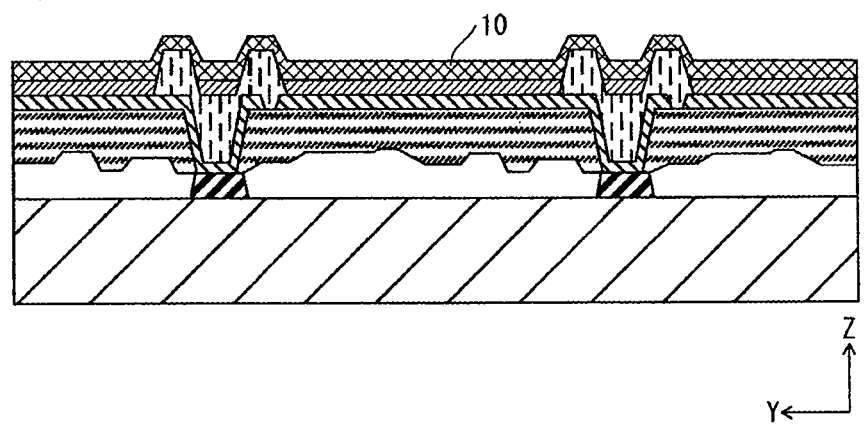

Next, on the surface of each light-emitting layer 9, a layer of ITO, IZO, or the like is formed by a vacuum deposition method. As a result, the upper electrode 10 is formed (FIG. 8G).

Furthermore, on the surface of the upper electrode 10, a layer of silicon nitride (SiN), silicon oxynitride (SiON), or the like is formed by the vacuum deposition method to form the passivation layer.

All of the organic EL elements 11a, 11b and 11c are formed by the above processes, thus completing the organic EL display panel 100.

(Inkjet Device System 1000)

The following is a description of the inkjet device system 1000, which is used in the above-described wet process.

Figure 5:
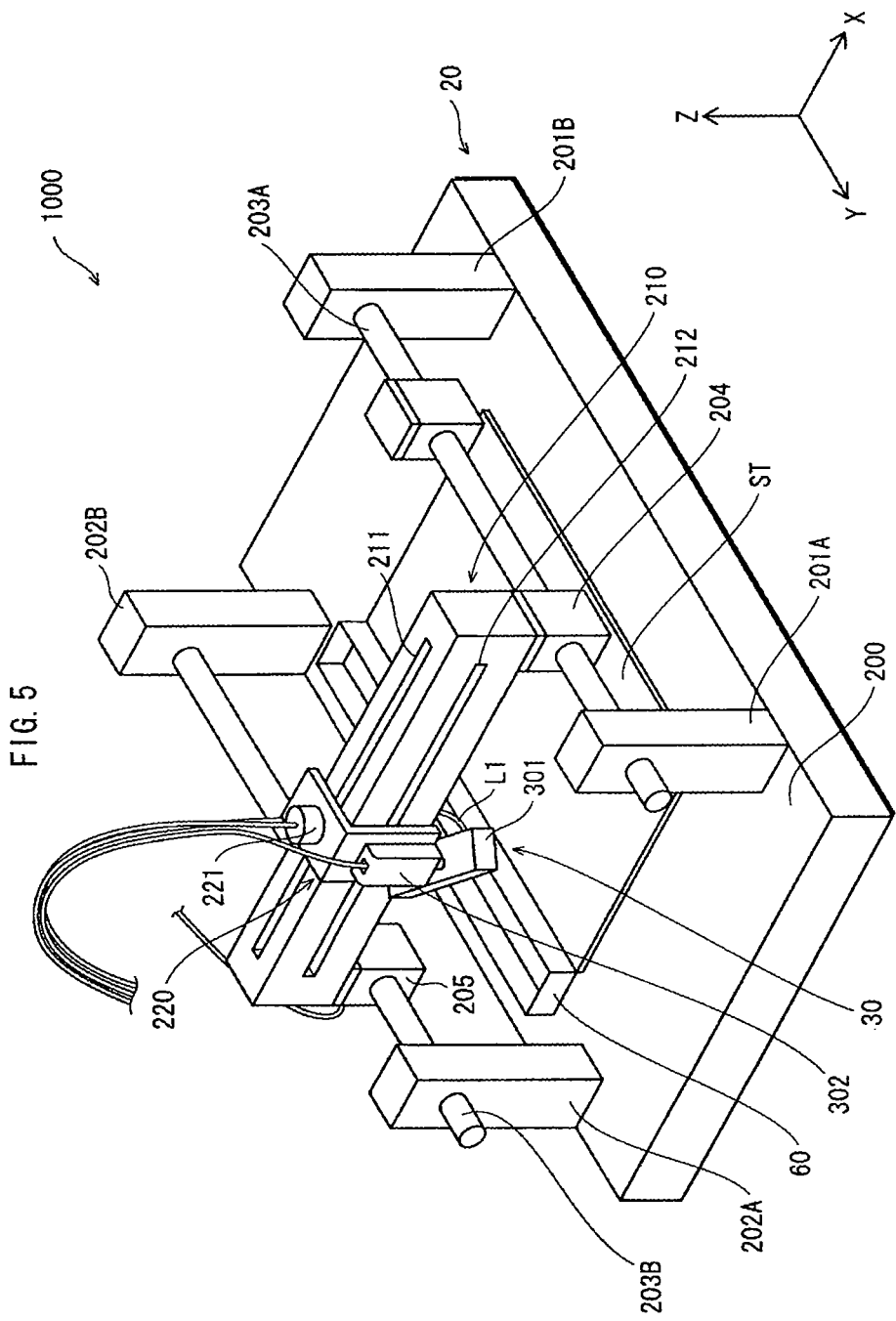
FIG. 5 shows a partial structure of an inkjet device system.
Figure 6:
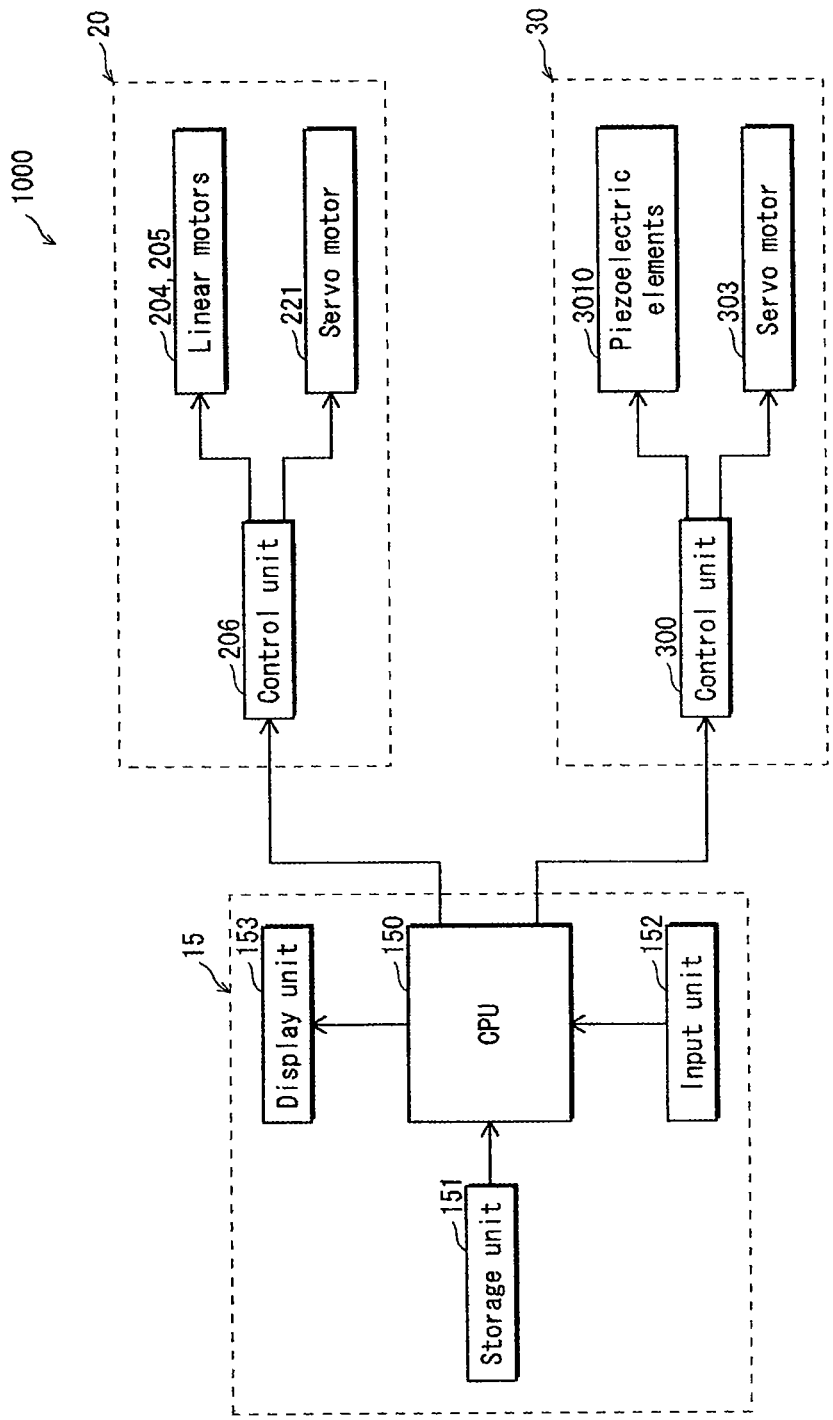
FIG. 6 is a functional block diagram of the inkjet device system.

FIG. 5 shows a principal structure of the inkjet device system (hereinafter, "system") 1000. FIG. 6 is a functional block diagram of the system 1000.

As shown in FIGS. 5 and 6, the system 1000 includes an inkjet table 20, an inkjet head 30, and a control device (PC) 15.

The control device 15 is composed of CPU 150, a storage unit 151 (including a mass-storage unit such as HDD), a display unit (display) 153, and an input unit 152. One specific example of the control device 15 is a personal computer (PC). The storage unit 151 stores therein control programs for driving the inkjet table 20 connected to the control device 15. When the system 1000 is driven, the CPU 150 performs predetermined control based on an instruction input by an operator via the input unit 152 and the control programs stored in the storage unit 151.

Although not illustrated in the drawings, the system 1000 may be connected to a commonly-known drop observation device for checking drops of ink ejected by the inkjet head 30 in such a manner that the CPU 150 can control the drop observation device.

(Inkjet Table 20)

The inkjet table 20 is a so-called gantry work table where a gantry unit (movable frame) is movably disposed along a pair of guiding shafts on a base table.

A specific structure of the inkjet table 20 is as follows. Columns 201A, 201B, 202A and 202B are arranged at the four corners of an upper surface of a plate-like base 200. A fixed stage ST and an ink pan (dish-like container) 60 are disposed in an inner region surrounded by the columns 201A, 201B, 202A and 202B. The substrate (ejection target substrate) on which the bank 7 and concaves 8 have been formed is placed on the fixed stage ST. Immediately before the ink is ejected onto the substrate, the ink is ejected into the ink pan 60 to stabilize the ink.

Furthermore, above the base 200, guiding shafts 203A and 203B are supported by the columns 201A, 201B, 202A and 202B in such a manner that the guiding shafts 203A and 203B extend along two lateral sides of the base 200 (sides extending in the Y direction), respectively, in parallel with each other. The guiding shafts 203A and 203B are inserted through linear motors 204 and 205, respectively. A gantry unit 210 is mounted on the linear motors 204 and 205 so as to extend across the base 200 in the X direction. With the above structure, when the system 1000 is driven, the gantry unit 210 slides back and forth in the longitudinal direction of the guiding shafts 203A and 203B due to driving of the pair of linear motors 204 and 205.

A movable member (carriage) 220 composed of an L-shaped mount is disposed on the gantry unit 210. The movable member 220 is provided with a servo motor 221 (dedicated to the movable member 220). Gears (not illustrated) are attached to the tip of the axis of the servo motor 221. The gears fit into a guiding groove 211 extending in the longitudinal direction of the gantry unit 210 (the X direction). A small rack extending in the longitudinal direction of the gantry unit 210 is disposed inside the guiding groove 211. The gears are engaged with the rack. Accordingly, when the servo motor 221 is driven, the movable member 220 moves back and forth with precision in the X direction due to a rack and pinion mechanism. The inkjet head 30 is attached to the movable member 220.

When illustrated as functional blocks as in FIG. 6, the linear motors 204 and 205 and the servo motor 221 are all connected to a control unit 206 that directly controls driving of the linear motors 204 and 205 and the servo motor 221. The control unit 206 is connected to the CPU 150 of the control device 15. When the system 1000 is driven, the CPU 150 that has read the control programs controls driving of each of the linear motors 204 and 205 and the servo motor 221 via the control unit 206.

It should be noted that the linear motors 204 and 205 and the servo motor 221 are merely examples of means for moving the gantry unit 210 and the movable member 220. Use of the linear motors 204 and 205 and the servo motor 221 is not indispensable. For example, a timing belt mechanism or a ball screw mechanism may be used to move at least one of the gantry unit 210 and the movable member 220.

(Inkjet Head 30)

The inkjet head 30 employs a well-known piezoelectric method, and is compose of a head unit 301 and a body 302 shown in FIG. 5, as well as a control unit 300 shown in FIG. 6. A servo motor 303 is built in the body 302. The inkjet head 30 is fixed to the movable member 220 via the body 302. As shown in FIG. 5, the external appearance of the head unit 301 is a cuboid. A central portion of the upper surface of the head unit 301 is hung from the tip of the axis of the servo motor 303 in the body 302. With the above structure, a plurality of nozzles 3030 arranged in the bottom region of the head unit 301 (see FIGS. 7A and 7B) face the fixed stage ST at a predetermined angle in accordance with axial rotation of the servo motor 303.

Figure 7A:
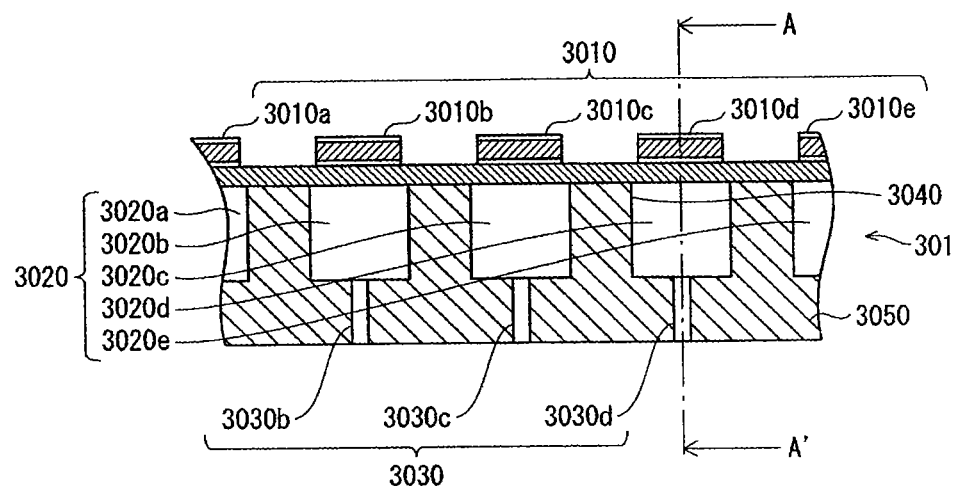
FIGS. 7A and 7B are cross-sectional views each showing the structure of an inkjet head.
Figure 7B:
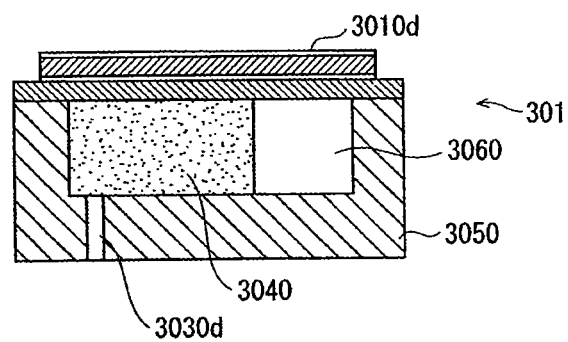

FIGS. 7A and 7B are cross-sectional views each showing an internal structure of the head unit 301. FIG. 7A shows a cross-section of the head unit 301 taken along the longitudinal direction of the head unit 301. FIG. 7B shows a cross-section of the head unit 301 taken along a direction perpendicular to the longitudinal direction of the head unit 301, as seen from the direction indicated by arrows A and A'. FIGS. 7A and 7B each show a part of five ink ejection mechanisms that have been adjacently formed in the head unit 301. The five ink ejection mechanisms include ink containers 3020a through 3020e, nozzles 3030a through 3030e, and piezoelectric elements 3010a through 3010e.

As shown in FIG. 7A, a plurality of (e.g., 128) ink ejection mechanisms for ejecting ink are arranged in line in the head unit 301 along the longitudinal direction of the head unit 301 at a predetermined interval.

Each of the ink ejection mechanisms has the following structure: the ink container 3020 and the nozzle 3030 are integrally formed in a frame 3050; a vibration plate 3040 is disposed to cover the ink container 3020; and the piezoelectric element 3010 is overlaid on the vibration plate 3040. Each ink ejection mechanism is driven individually by applying voltage to a corresponding one of the piezoelectric elements 3010.

The frame 3050 is made of a metal material (e.g., SUS) or a ceramic material. The plurality of ink containers 3020 and nozzles 3030 are formed inside the frame 3050 by performing machining, etching, or electrical discharge machining on the frame 3050.

Each ink container 3020 is a space where the ink is stored immediately before ink ejection. The volume of each ink container 3020 is reversibly reduced or restored by driving the corresponding piezoelectric element 3010. As shown in FIG. 7B, each pair of adjacent ink containers 3020 is separated from each other with a dividing wall 3040 therebetween. Rear portions of the ink containers 3020 are each linked to an ink passage 3060. The ink passage 3060 is connected to a supply tube L1 (see FIG. 5) that extends toward the outside of the head unit 301. When the system 1000 is driven, ink is supplied to the ink passage 3060 from an ink tank (not illustrated) through the supply tube L1 due to pressure applied via driving of a pump. As a result, each ink container 3020 is filled with the ink.

In the bottom region of the frame 3050, the nozzles 3030 are arranged in line at a predetermined pitch so that each nozzle 3030 is linked to a corresponding one of the ink containers 3020. In terms of structure, each pair of adjacent nozzles 3030 has a fixed pitch therebetween. However, a nozzle pitch in relation to the ejection target substrate can be adjusted by changing the rotational angle of the axis of the servo motor 303 with respect to the fixed stage ST. Here, the CPU 150 adjusts the servo motor 303 so that each nozzle 3030 passes over one of the openings 13 or concaves 8. This makes it possible to set every nozzle 3030 to eject ink.

The nozzles 3030 are not limited to being arranged in line as described above. Alternatively, the nozzles 3030 may be arranged in rows, or in rows that form a zigzag pattern.

Also, the number of the ink passage 3060 is not limited to one. Alternatively, a plurality of ink passages 3060 may be formed inside the head unit 301. In this case, the ink ejection mechanisms may be divided into a plurality of groups, so that different groups can eject ink supplied via different paths (e.g., so that different groups can eject inks of different colors or components).

The vibration plate 3040 is a thin plate made of stainless steel or nickel. The vibration plate 3040 and the piezoelectric elements 3010 overlaid thereon are both deformable.

The commonly-known piezoelectric elements 3010 are each a layered body formed by sandwiching a plate-like piezoelectric material made of lead zirconate titanate or the like between a pair of electrodes. As shown in FIG. 6, a power supply to each pair of electrodes is managed by the CPU 150 via the control unit 300. Ink is intermittently ejected in accordance with a predetermined control program stored in the storage unit 151. More specifically, a pulse voltage having a rectangular waveform is applied to each pair of electrodes at a driving frequency of several hundred Hz, with each pulse having a width of several hundred μs. The piezoelectric elements 3010 deform on the rising edges of the pulse voltage having the rectangular waveform. Deformation of the piezoelectric elements 3010 triggers deformation of the vibration plate 3040, which causes reduction or restoration of the volume of each ink container 3020. The ink is ejected from the nozzles 3030 upon such reduction in the volume of each ink container 3020. Note that the pulse voltage is not limited to having a rectangular waveform, but may have a step waveform or a partially curved waveform.

When the system 1000 is driven, the CPU 150 reads a predetermined control program from the storage unit 151, and notifies the control unit 300 of the pulse voltage and the driving frequency at which the voltage should be applied. A normal default setting causes each nozzle 3030 to eject drops of ink at the same ink ejection speed as the all other nozzles 3030 (i.e., the speed of ejected drops of ink until they reach the surface of the ejection target substrate).

Furthermore, the CPU 150 adjusts the amount (volume) of ink to be ejected through each nozzle 3030 in correspondence with the openings 13 or the concaves 8 on the ejection target substrate. Generally, on the ejection target substrate, the volume of each opening 13 is larger than the volume of each concave 8. Accordingly, the volume of ink ejected into each opening 13 is set to be larger than the volume of ink ejected into each concave 8.

Accordingly, the CPU 150 may adjust the volume of ink ejected from each nozzle 3030 by using the following first method: at first, each nozzle 3030 is set to eject the same volume of ink (i.e., drops of ink having the same volume) at each ink ejection; thereafter, by adjusting the driving frequency of the pulse voltage, each nozzle 3030 is further set such that the number of times the ink ejection is performed into each opening 13 is greater than the number of times the ink ejection is performed into each concave 8. Alternatively, the number of times the ink ejection is performed into each opening 13 or each concave 8 may be adjusted in the following manner: first, the pulse voltage is set to be applied at a constant driving frequency; then, a relative moving speed of the inkjet head 30 with respect to the ejection target substrate is set to be slow on each opening 13 and fast on each concave 8.

Alternatively, the CPU 150 may adjust the volume of ink ejected from each nozzle 3030 by using the following second method: at first, each nozzle 3030 is set such that the number of times the ink ejection is performed into each opening 13 is the same as the number of times the ink ejection is performed into each concave 8; thereafter, by adjusting the value of the pulse voltage, each nozzle 3030 is set to eject a large volume of ink (drops of ink) into each opening 13 and a small volume of ink into each concave 8 at each ink ejection.

It goes without saying that the volume of ink to be ejected may be adjusted by using a combination of the above-described first method (control on the number of times of ink ejection) and second method (control on the volume of drops of ink to be ejected).

By adjusting the volume of ink to be ejected into each opening 13 and each concave 8 in the above manner, the following advantages can be achieved. First, the problem of overflow of the ink ejected into the concaves 8, which results in leakage of the ink into the openings 13, can be prevented. Second, wasteful use of ink can be avoided, and thus a cost increase can be prevented.

(System Operations)

Figure 9:
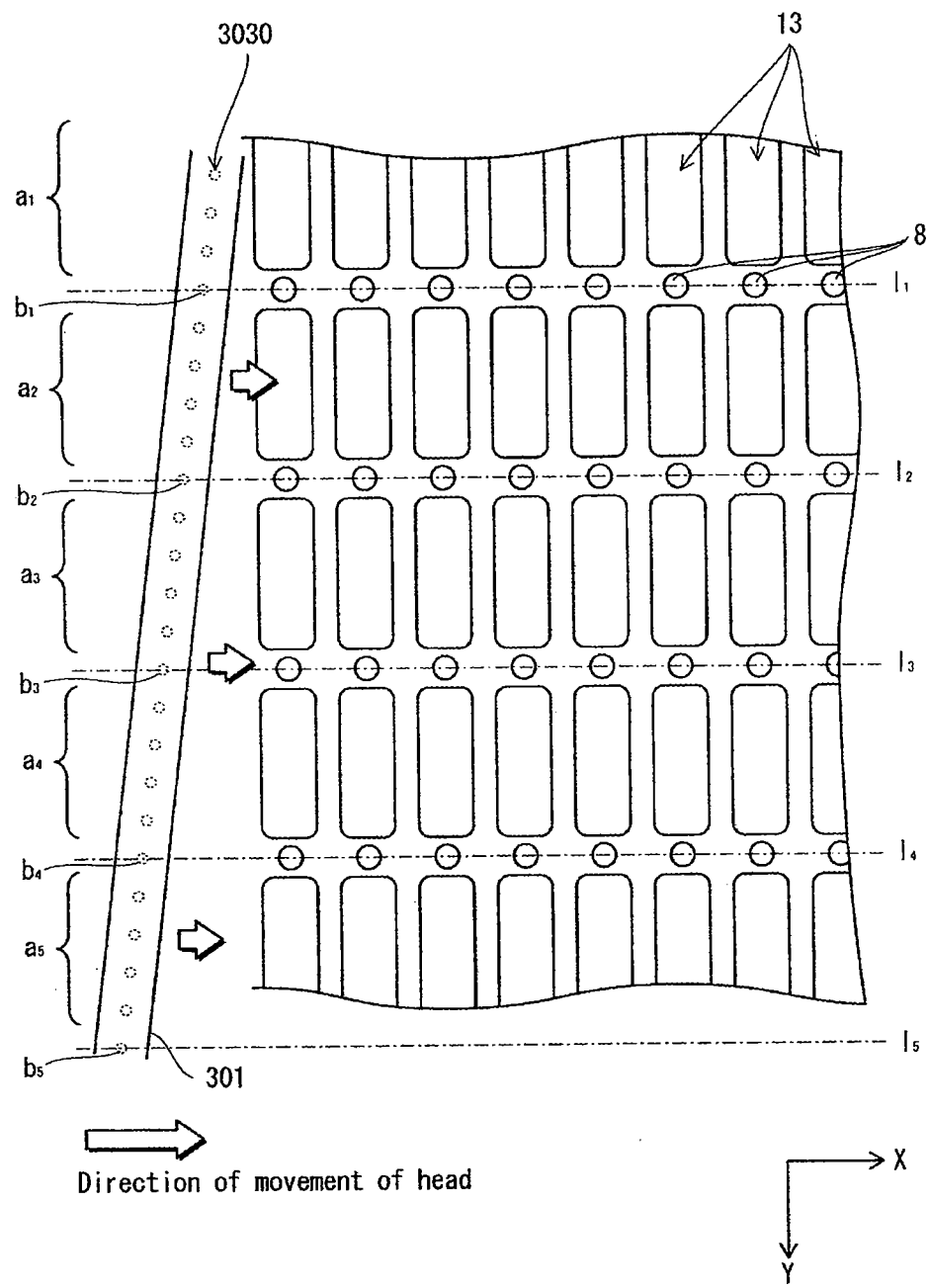
FIG. 9 shows a positional relationship between the inkjet head and an ejection target substrate (for horizontal ink ejection).

In a case where the wet process of the inkjet method is performed by using the system 1000 having the above structure, an operator first operates the input unit 152, and performs the ink ejection by causing the inkjet head 30 to scan the ejection target substrate in one of the row (X) and column (Y) directions. Firstly, the following describes the case where the ink ejection is performed in the row (X) direction (horizontal ink ejection). Based on the information input by the operator, the CPU 150 drives the servo motor 303 via the control unit 300 so as to rotate the servo motor 303 by a predetermined angle. As a result, the angle of the head unit 301 with respect to the fixed stage ST is set. FIG. 9 shows a positional relationship between the inkjet head 30 and the ejection target substrate at the time of performing the horizontal ink ejection. In the example of FIG. 9, the head unit 301 is slightly tilted so that its longitudinal direction is not in line with the Y direction. This makes the ejection pitch between every pair of nozzles 3030 narrow. Furthermore, every nozzle 3030 is set to pass above one of the openings 13 and concaves 8 (i.e., to eject ink). This way, the ink is reliably ejected into all of the openings 13 and concaves 8. The angle of the inkjet head 30 with respect to the ejection target substrate is properly adjusted depending on the standard, the size, or the like of the ejection target substrate.

Note that the angle of the inkjet head 30 may be adjusted anytime before the actual ink ejection.

Next, the operator stores ink having an adjusted composition into the ink tank, and actuates the pump. Consequently, the ink is filled in the ink containers 3020 in the head unit 301 via the supply tube L1.

Thereafter, the operator operates the control device 15 to move the head unit 301 until the head unit 301 is positioned above the ink pan 60. In this state, the CPU 150 applies voltage to each piezoelectric element 3010 via the control unit 300, and causes all of the nozzles 3030 to eject ink into the ink pan 60.

In a case where a drop observation device is used in the system 1000, images of the state of the ink ejected from the nozzles 3030 at this time can be taken by a CCD camera, and the CPU 150 can display the taken images real-time on the display unit 153. The operator checks, on the display unit 153, whether all of the nozzles are properly ejecting the ink, and instructs the CPU 150 to continue the ink ejection until the ink ejection is stabilized.

Next, the CPU 150 performs default settings for the nozzles 3030 in accordance with the control programs stored in the storage unit 151, so that the voltage applied to each nozzle 3030 has a predetermined value (default voltage). This way, all of the nozzles 3030 eject ink at the same ink ejection speed. When the default settings are completed, as shown in FIG. 9, the CPU 150 causes the inkjet head 30 (in FIG. 9, the head unit 301) to scan in the row (X) direction while intermittently ejecting the ink via application of a pulse voltage. This way, a predetermined amount of ink is ejected into each opening 13 and each concave 8.

The plurality of nozzles 3030 are divided into different groups. Groups $a_1, a_2, \ldots$ each contain a plurality of adjacent nozzles 3030. Upon performing the ink ejection along the row (X) direction, each of these groups $a_1, a_2, \ldots$ ejects ink into a corresponding one of the openings 13. Here, Embodiment 1 is characteristic in that any nozzle 3030 positioned between groups $a_1$ and $a_2$, between groups $a_2$ and $a_3$, and so on (namely, nozzles $b_1, b_2, \ldots$) is not used to eject ink into the openings 13, but is used to eject ink into the concaves 8 that are arranged on lines $l_1, l_2, \ldots$ extending along the row (X) direction. In the above manner, all of the nozzles 3030 in the inkjet head 30 are used to eject ink into the openings 13 or concaves 8. As every nozzle 3030 is set to eject ink, clogging of the nozzles 3030 can be prevented.

Figure 10:
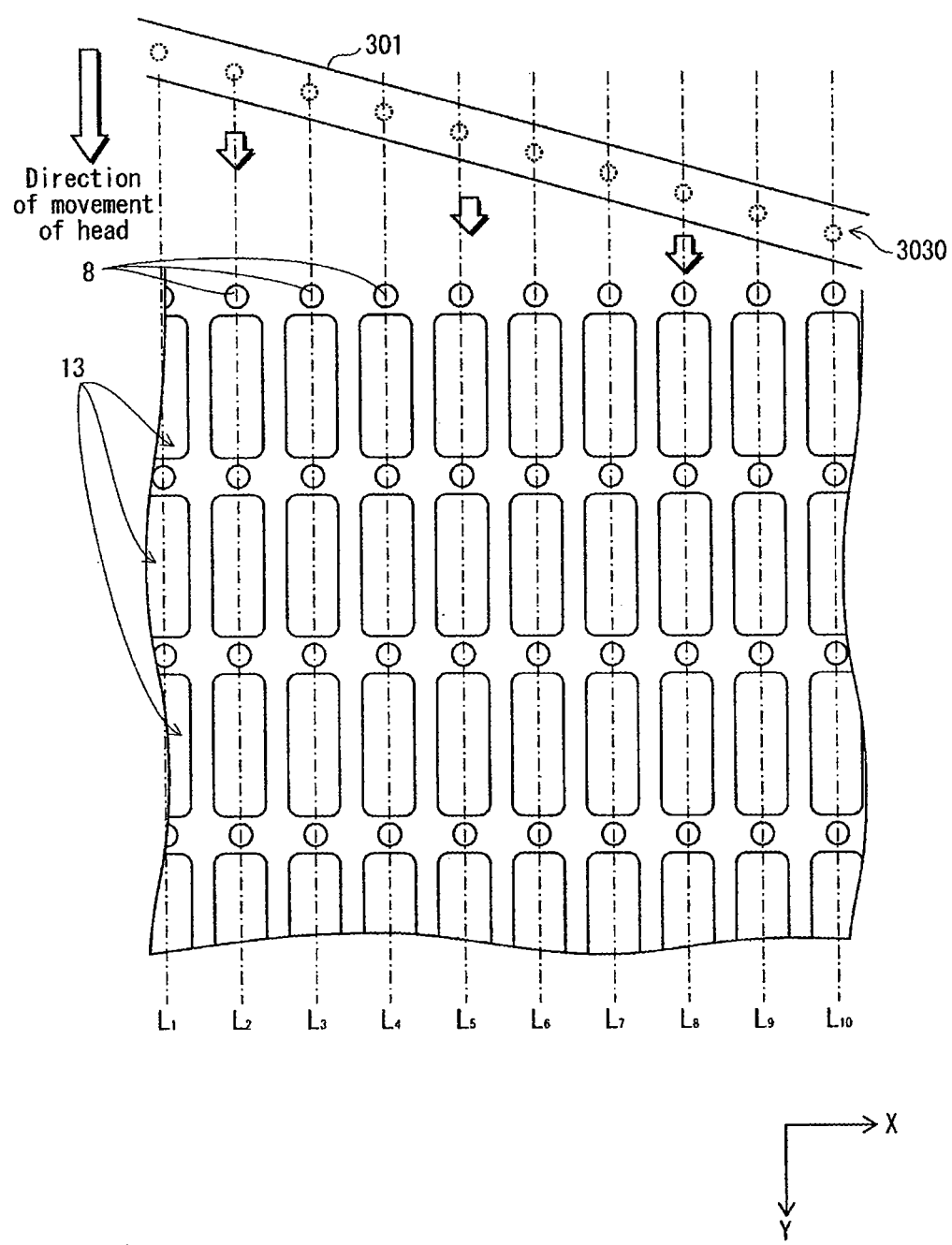
FIG. 10 shows a positional relationship between the inkjet head and the ejection target substrate (for vertical ink ejection).

Secondly, the following describes the case where the ink ejection is performed by causing the inkjet head 30 to scan in the column (Y) direction (vertical ink ejection). FIG. 10 shows a positional relationship between the inkjet head 30 and the substrate at the time of performing the vertical ink ejection. In the case of the vertical ink ejection, the angle of the inkjet head 30 is adjusted such that all of the positions of the nozzles 3030 correspond one-to-one to adjacent lines $L_1$, $L_2, \ldots$ extending along the column (Y) direction—i.e., the positions of the openings 13 in each row extending in the X direction. The nozzles 3030 eject drops of ink alternately into the openings 13 and the concaves 8 while scanning in the column (Y) direction.

In the case of the vertical ink ejection, the nozzles 3030 intermittently eject the ink while scanning in the column (Y) direction. Here, the nozzles 3030 also eject the ink into each concave 8 positioned between a corresponding pair of openings 13 adjacent in the column (Y) direction. Accordingly, in the case of the vertical ink ejection, the time period during which the nozzles 3030 halt the ink ejection is shorter than that pertaining to conventional cases. Hence, the vertical ink ejection can also effectively prevent the nozzles 3030 from being clogged with the ink.

Figure 19A:
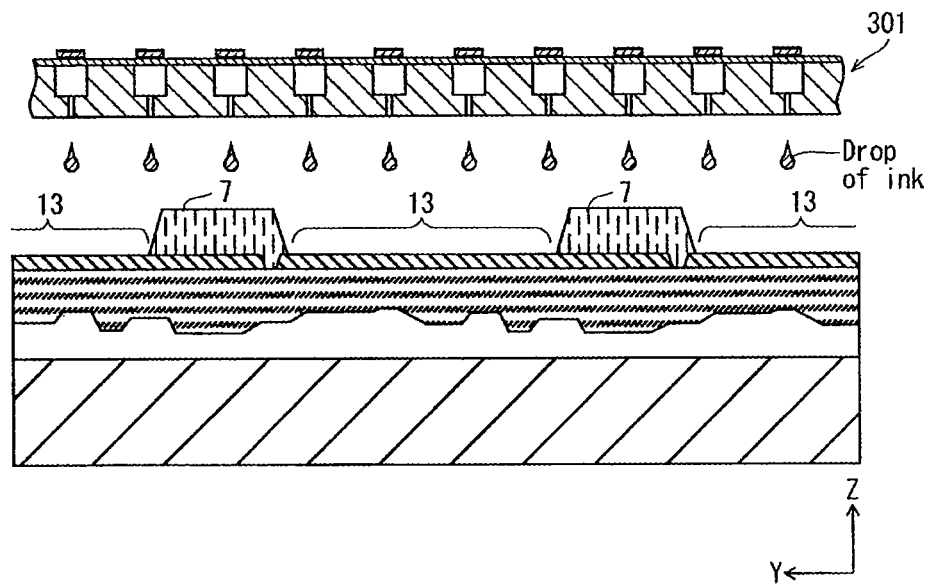
FIGS. 19A and 19B illustrate a problem with a conventional manufacturing process for an organic EL display panel.
Figure 19B:
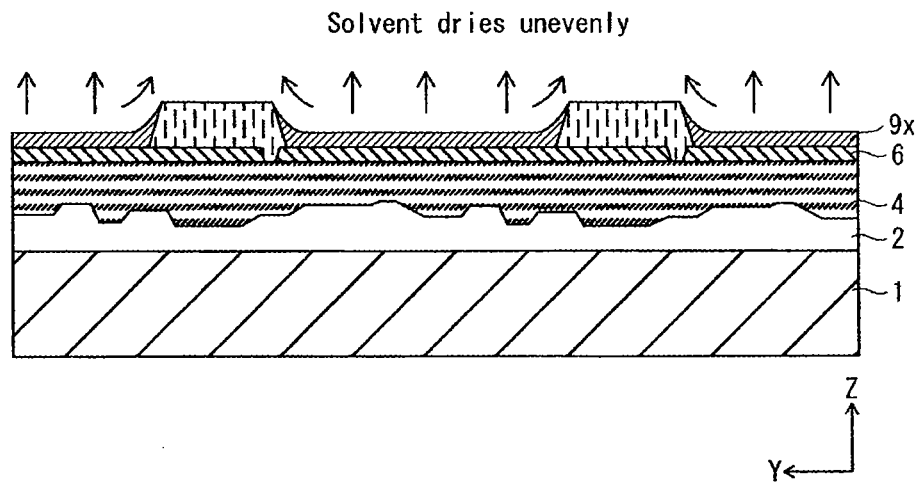
Figure 20:
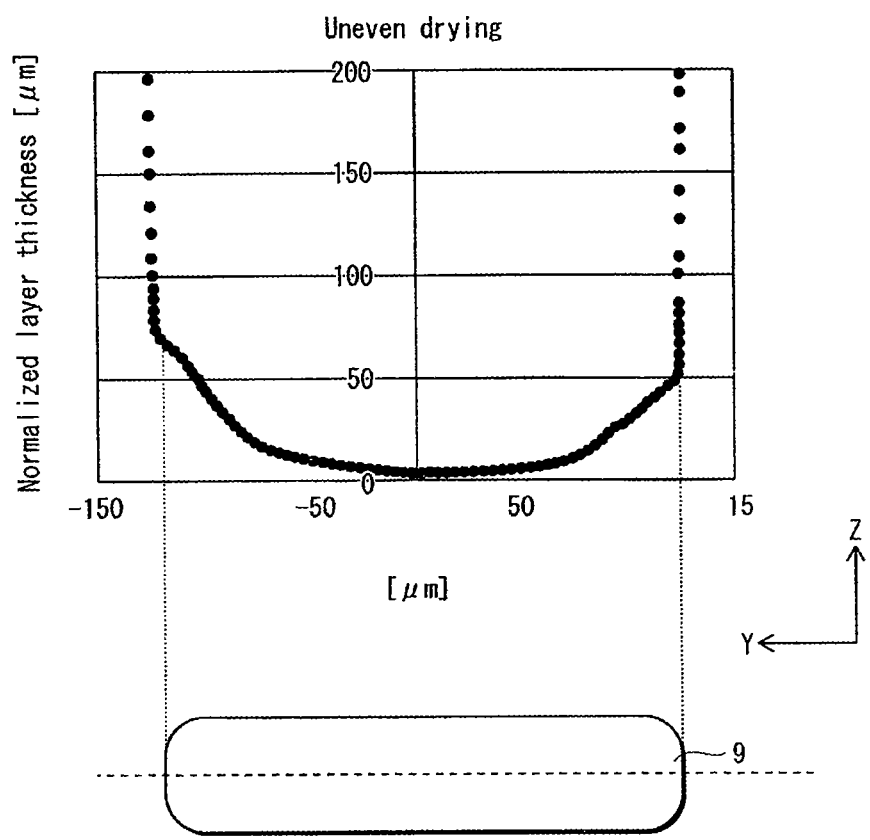
FIG. 20 shows the conventional problem (unevenness in the thickness of light-emitting layers).
Figure 20:
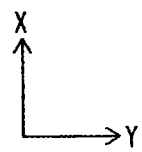

After the ink is ejected in the above manner, the ink puddles $9x$ and $12x$ in the openings 13 and concaves 8 shown in FIG. 11 are exposed to a dried air atmosphere, and the solvent in the ink puddles $9x$ and $12x$ is dried by evaporation. At this time, the solvent in the ink puddles $12x$ of the concaves 8 evaporates. Accordingly, in each opening 13, an atmosphere with a relatively uniform concentration of vaporized solvent is created in the central region of the opening 13 through both edges of the opening 13 in the column (Y) direction, thus promoting drying of the solvent. This can prevent the conventional problem shown in FIG. 19B, namely, progress in a dried state with uneven concentration of vaporized solvent. Especially, in each opening 13, the increase in the thickness of the dried light-emitting layer 9 can be suppressed around both edges of the opening 13 in the column (Y) direction. As a result, the light-emitting layers 9 have a uniform thickness as a whole.

Note that the distance between any pair of openings 13 adjacent in the row (X) direction is smaller than the distance between any pair of openings 13 adjacent in the column (Y) direction. Therefore, the problem of unevenness in the thickness of each light-emitting layer 9 (formed as a result of drying the solvent) along the row (X) direction is miniscule. Still, by making the concentration of vaporized solvent uniform in the above-described manner, the thickness of each light-emitting layer 9 becomes uniform to a greater extent.

Described below are examples of the amount of ink to be ejected. Assume a case where, as shown in FIG. 3, the bank 7 has a height H of approximately 1 μm, each of the bottom surfaces of the concaves 8 has a diameter of approximately 20 μm, and each of the concaves 8 has a depth of approximately 1 μm. In this case, the adjustment is made so that the ink ejected into each concave 8 has a height of approximately 15 μm, the height being measured from the top surface of the ejected ink to the bottom surface of the concave 8. In this case, the solvent in the ink completely dries, and therefore the volume of the ink shrinks. Consequently, the organic layer 12 having a thickness of approximately 50 nm to 100 nm is formed in each concave 8. It is known that ink containing acrylic resin should preferably be used to make the ink shrink in accordance with the shape of each concave 8.

As described above, in Embodiment 1, drops of ink made of the same material as the light-emitting layers 9 are ejected into the concaves 8 formed in the upper surfaces of the bank 7. Hence, Embodiment 1 enables formation of the light-emitting layers 9 having a uniform thickness, and obtainment of the organic EL display panel 100 capable of achieving excellent image display performance. In addition, Embodiment 1 can also prevent clogging of the nozzles 3030 in the inkjet head 30, and allows manufacturing the organic EL display panel 100 with favorable production efficiency.

Furthermore, Embodiment 1 makes use of commonly-known concaves (8), which are formed in upper surfaces of portions of the bank 7 that correspond to the positions of the contact holes 5. More specifically, the concaves (8) are used as structural elements into which the nozzles 3030 eject ink in the form of dummy ejection. It is therefore unnecessary to provide the upper surface of the bank 7 with additional concaves, dents, holes, or the like for dummy ejection. Accordingly, Embodiment 1 is advantageous in terms of relatively low-cost manufacturing and excellent viability.

The following explains another embodiment of the present invention in distinction from Embodiment 1.

Embodiment 2

Figure 12:
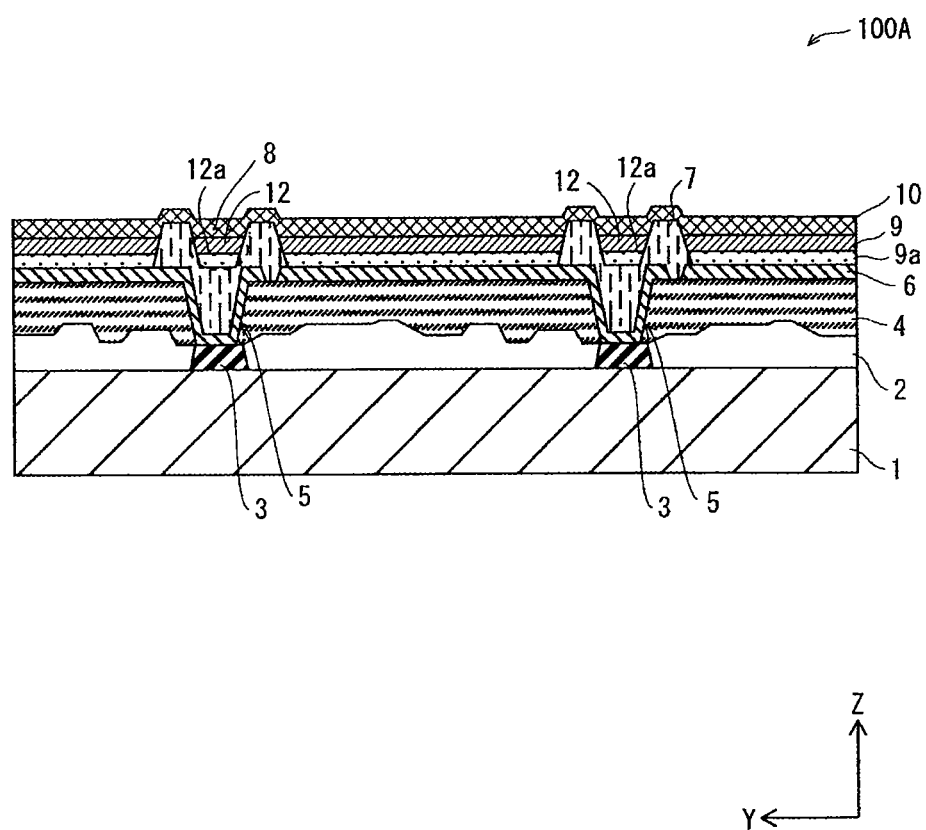
FIG. 12 is a schematic cross-sectional view showing the structure of an organic EL display panel pertaining to Embodiment 2.

FIG. 12 is a schematic cross-sectional view showing the structure of an organic EL display panel 100A pertaining to Embodiment 2.

In the organic EL display panel 100A, a charge transport layer 9a is disposed beneath the light-emitting layer 9. The charge transport layer 9a improves luminous efficacy by suitably transporting a carrier toward the light-emitting layer 9. The charge transport layer 9a is formed in the wet process as with the light-emitting layer 9. More specifically, the charge transport layer 9a is formed by ejecting drops of ink containing a predetermined organic material (e.g., barium, phthalocyanine, lithium fluoride, or any combination of these materials) and solvent while maintaining the concentration of the vaporized solvent uniform along the column (Y) direction. This way, the charge transport layer 9a has a favorably uniform thickness. After the charge transport layer 9a is formed, the light-emitting layer 9 is formed thereon in the same manner as Embodiment 1.

The manufacturing process for the organic EL display panel 100A is fundamentally the same as the manufacturing process for the organic EL display panel 100 with the following exceptions. The charge transport layer 9a and light-emitting layer 9 are obtained by, in each of the steps of forming the charge transport layer 9a and the light-emitting layer 9, (i) performing a predetermined wet process of the inkjet method, (ii) ejecting predetermined ink into the openings 13 and the concaves 8, and (iii) drying a solvent in the ink by evaporation.

Figure 13:
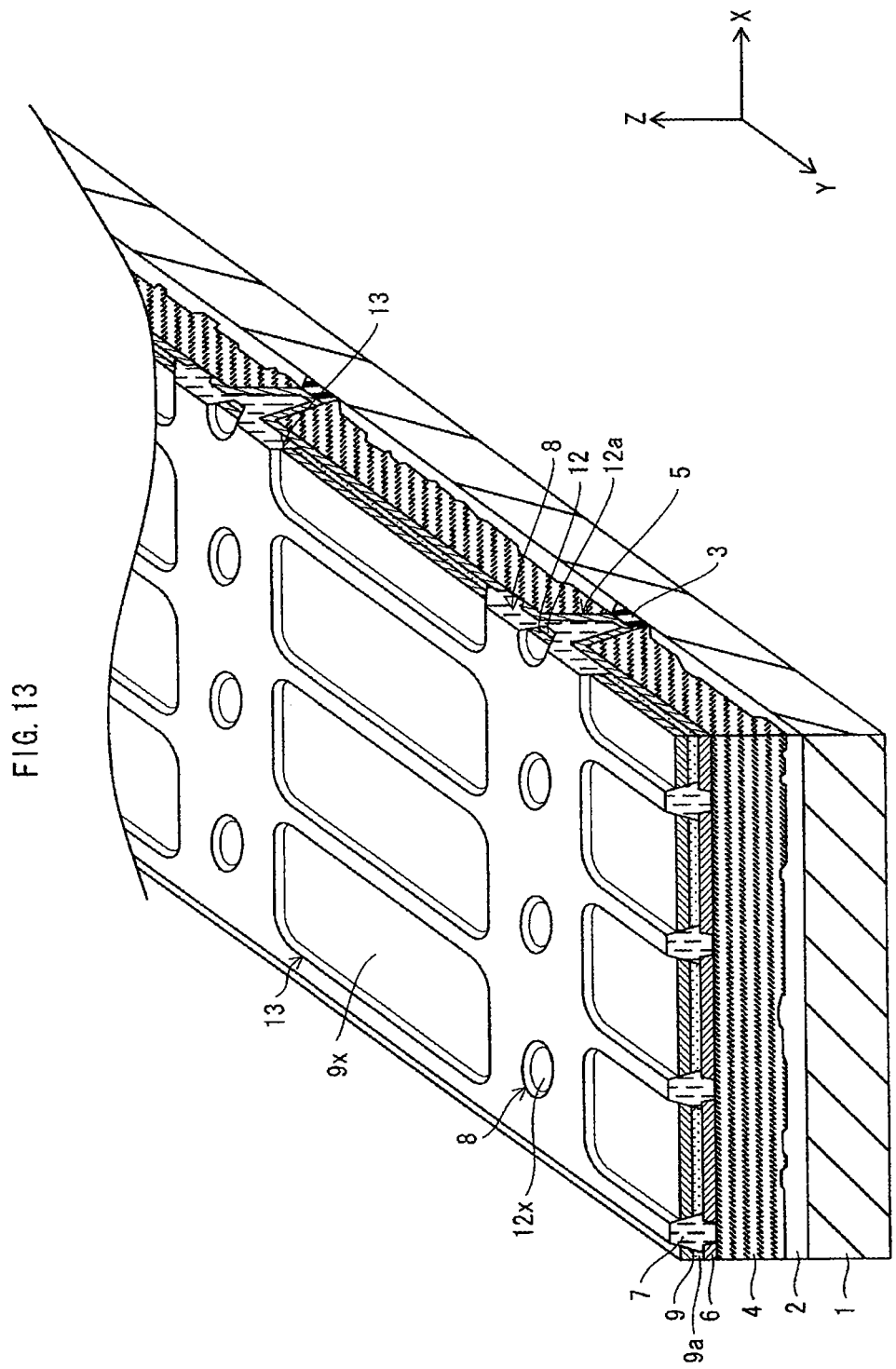
FIG. 13 is a cross-sectional perspective view showing the organic EL display panel immediately after the ink ejection.

FIG. 13 is a perspective view showing the organic EL display panel 100A immediately after the wet process is performed on the light-emitting layer 9. Referring to the example of FIG. 13, based on the same principle as Embodiment 1, the adjustment is made to make the concentration of the vaporized solvent uniform along the column (Y) direction in each opening 13 while the ink is being dried. As a result, the charge transport layer 9a and the light-emitting layer 9 each having a uniform thickness are formed. Hence, by providing the organic EL display panel 100A with the organic EL elements 11a, 11b and 11c that hardly bring about unevenness in light emission, the organic EL display panel 100A can achieve excellent image display performance as a whole. Furthermore, Embodiment 2 suitably prevents clogging of the nozzles 3030 in the inkjet head 30 in the same manner as Embodiment 1, thus sustaining/improving the production efficiency.

Embodiment 3

Figure 14:
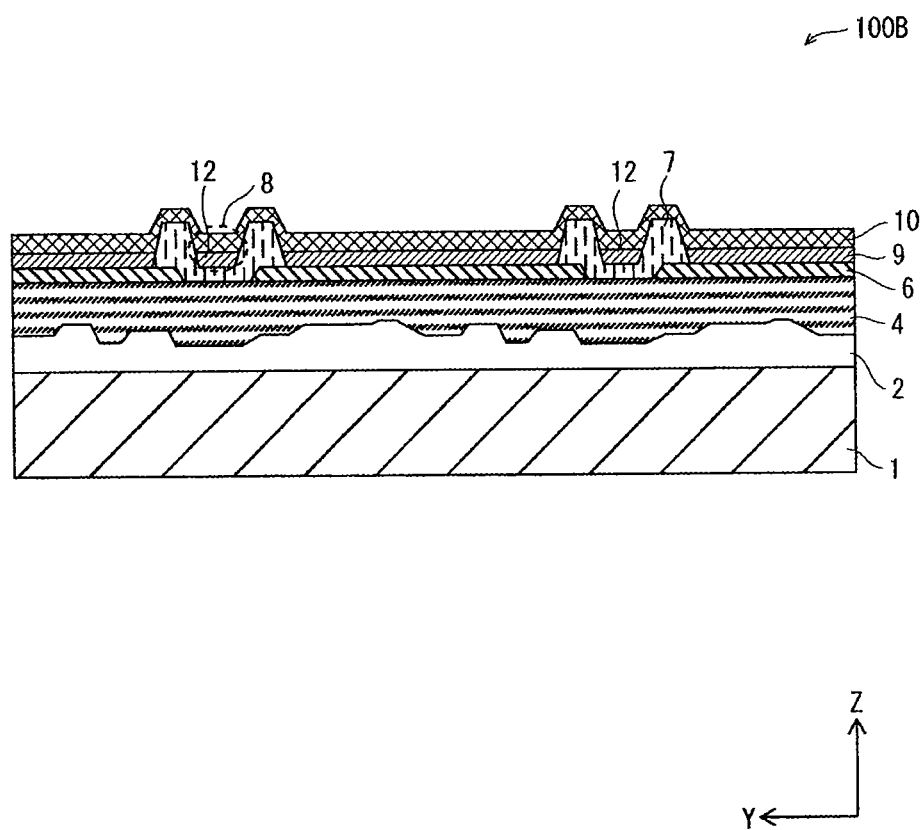
FIG. 14 is a schematic cross-sectional view showing the structure of an organic EL display panel pertaining to Embodiment 3.

FIG. 14 is a schematic cross-sectional view showing the structure of an organic EL display panel 100B pertaining to Embodiment 3.

In the organic EL display panel 100B, the contact holes 5 are not formed. Accordingly, the concaves 8 of the bank 7 are formed only through adjustment of the shape of the bank 7.

Figure 15:
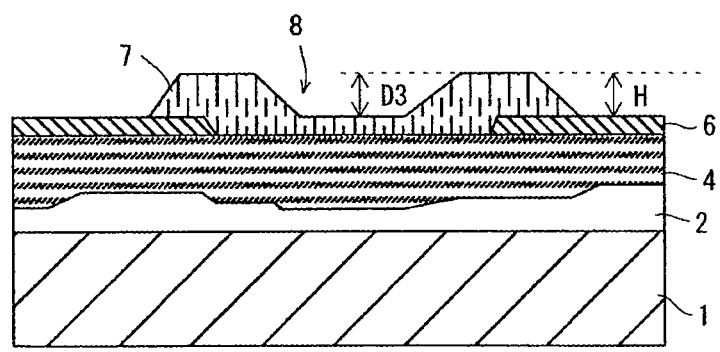
FIG. 15 is an enlarged schematic cross-sectional view showing the structure around a concave.

Here, as shown in FIG. 15, the depth D3 of each concave 8 is adjusted to be the same as the height H of the bank 7. Alternatively, the depth D3 may be adjusted to be smaller than or larger than the height H.

In this structure also, the same drops of ink are ejected into the openings 13 and the concaves 8 in the wet process of the inkjet method during the step of forming the light-emitting layer 9. As a result, the concentration of the vaporized solvent is made uniform while the ink is being dried, and the light-emitting layer 9 having a uniform thickness is formed.

Furthermore, the nozzles 3030 in the inkjet head 30 are caused to eject the ink into the concaves 8 in the form of dummy ejection—i.e., it is ensured that all of the nozzles 3030 eject ink. As a result, clogging of the nozzles 3030 is prevented, and favorable production efficiency is achieved.

As described above, the present invention is also applicable to the organic EL display panel 100B in which the contact holes 5 are not used (or not formed), as long as the concaves 8 are formed in the upper surface of the bank 7.

The following describes a manufacturing process for the organic EL display panel 100B step-by-step.

Figure 16A:
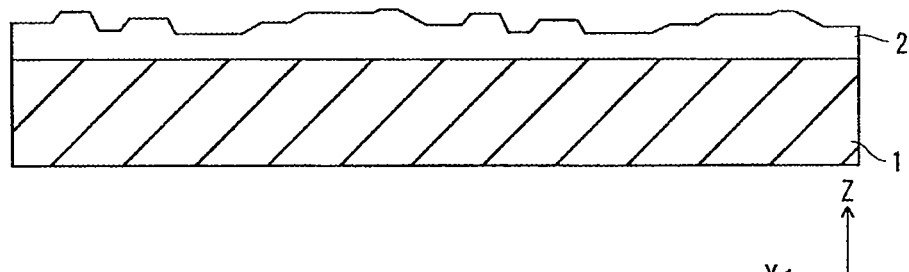
FIGS. 16A to 16D illustrate a manufacturing process for an organic EL display panel.
Figure 16B:
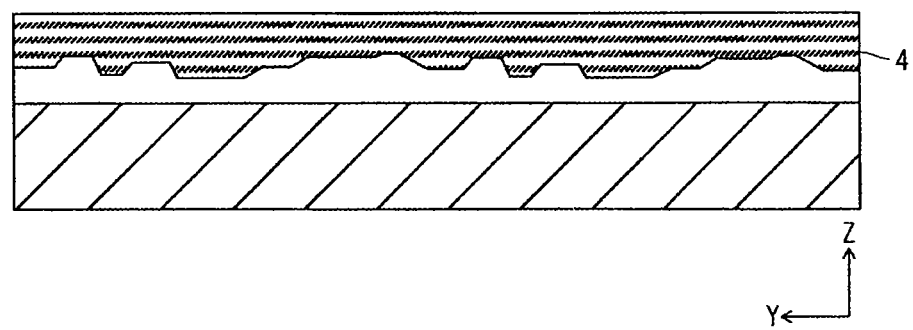
Figure 16C:
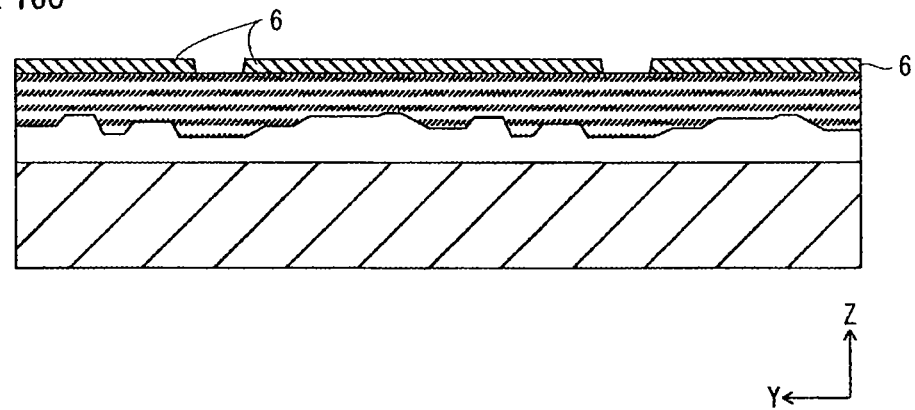

Firstly, in the same manner as Embodiment 1, the TFT layer 2 is formed on the surface of the substrate 1 (FIG. 16A), and the planarizing film 4 is uniformly formed on the surface of the TFT layer 2 (FIG. 16B). Then, the lower electrode 6 having a predetermined pattern is disposed on the surface of the planarizing film 4 (FIG. 16C).

Figure 16D:
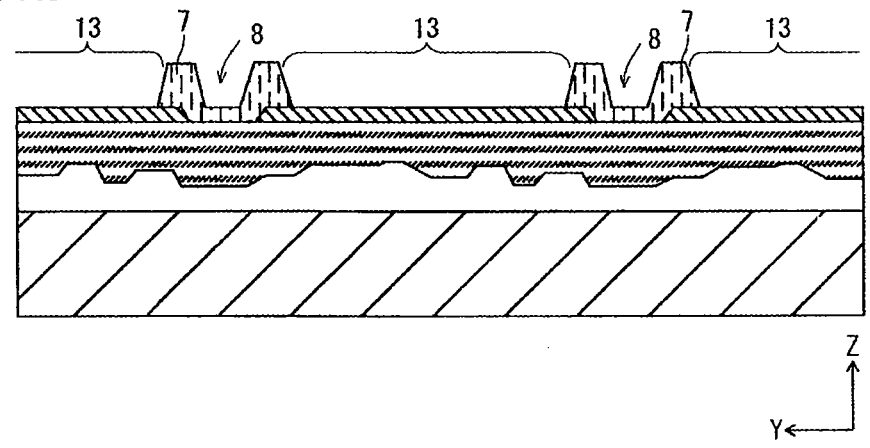

Next, the bank 7 having the openings 13 and the concaves 8 is formed in accordance with the photoresist method. In the present Embodiment 3, the concaves 8 are formed only through the patterning of the bank 7. More specifically, with use of a half-tone mask or the like, the concaves 8 are formed in upper surfaces of portions of the bank 7 so that each concave 8 is positioned between a corresponding pair of openings 13 adjacent in the column (Y) direction (FIG. 16D). As described above, even without making use of the contact holes 5, the concaves 8 can be formed relatively easily with the aid of the half-tone mask or the like. Therefore, Embodiment 3 is comparable to Embodiment 1 in terms of excellent viability.

Figure 17E:
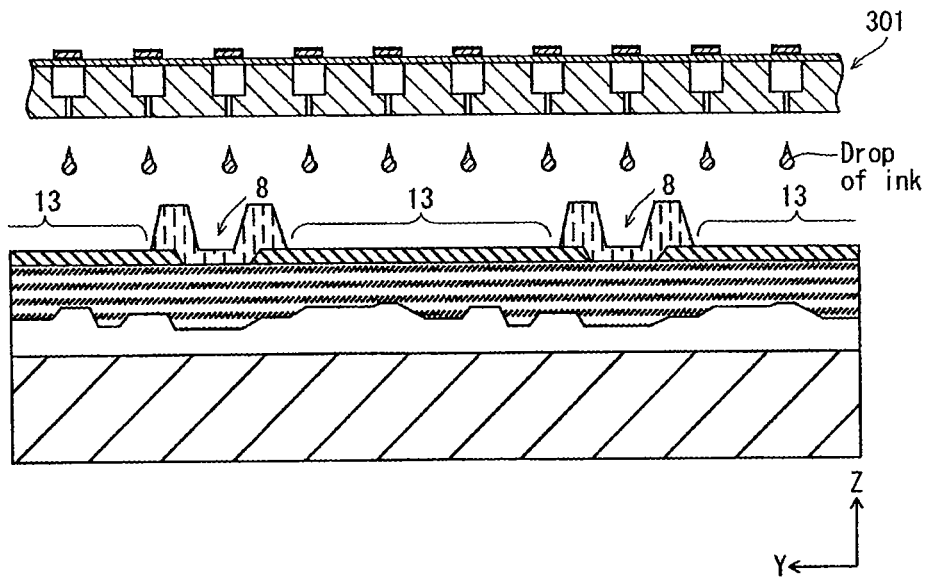
FIGS. 17E to 17G illustrate a manufacturing process for an organic EL display panel.
Figure 17F:
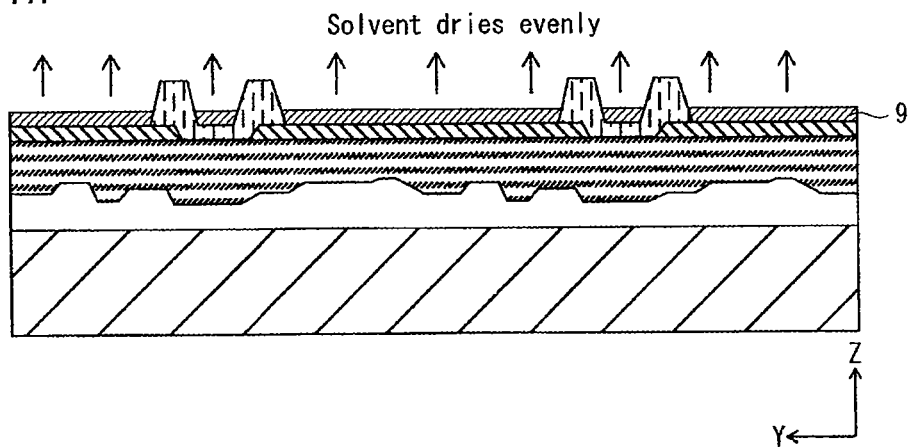
Figure 18:
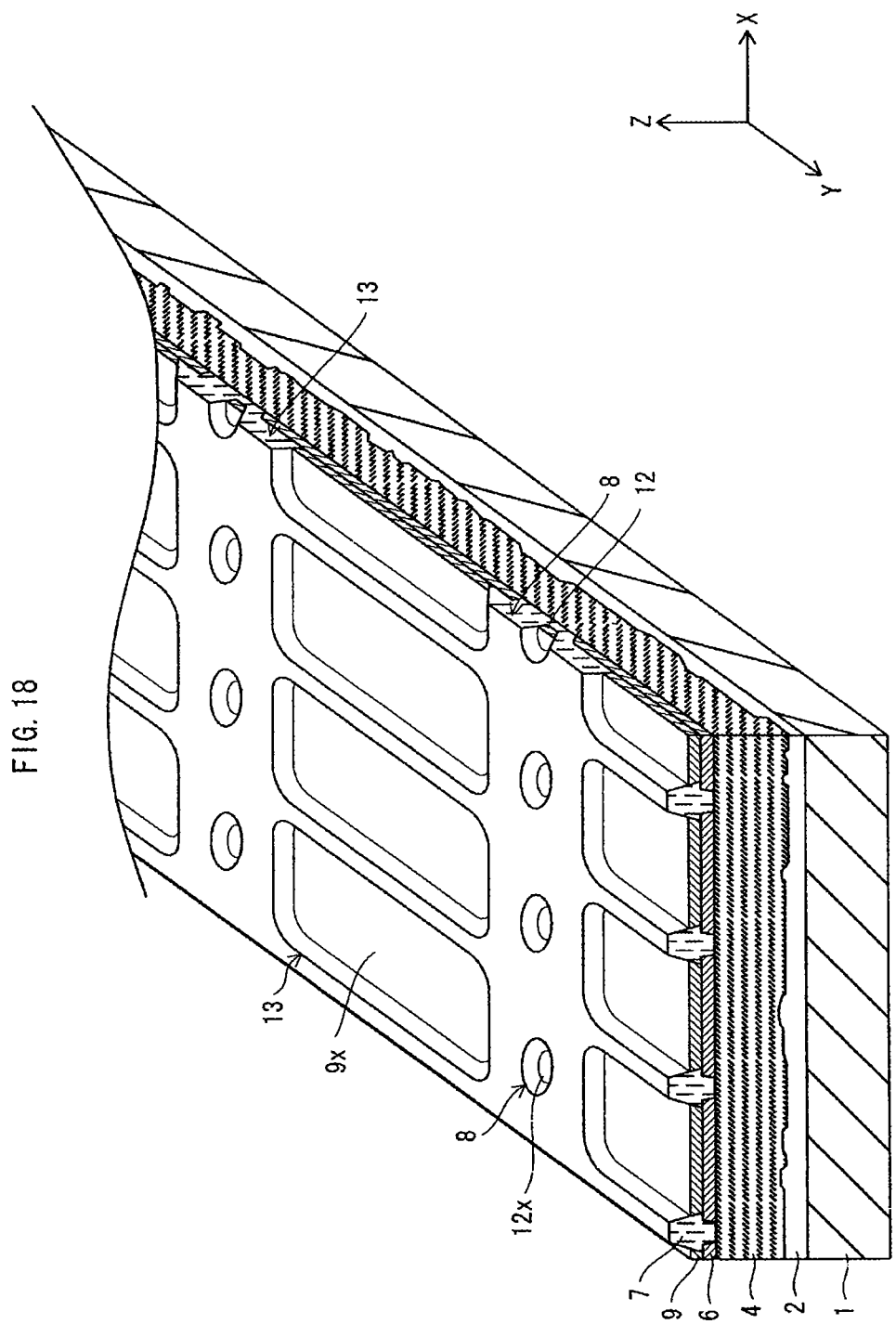
FIG. 18 is a cross-sectional perspective view showing the organic EL display panel immediately after the ink ejection.

Next, as with Embodiment 1, drops of ink are ejected into each opening 13 and each concave 8 in the wet process with use of the system 1000 (FIG. 17E). FIG. 18 is a partial perspective view of the organic EL display panel 100B, illustrating the ink puddles 9x and 12x formed in the openings 13 and concaves 8. As with Embodiment 1 or 2, when drying the ink, the solvent evaporates from the ink in each concave 8 positioned between a corresponding pair of openings 13 adjacent along the column (Y) direction. Consequently, the concentration of the vaporized solvent is made uniform, and the light-emitting layer 9 having a uniform thickness can be formed (FIG. 17F).

Figure 17G:
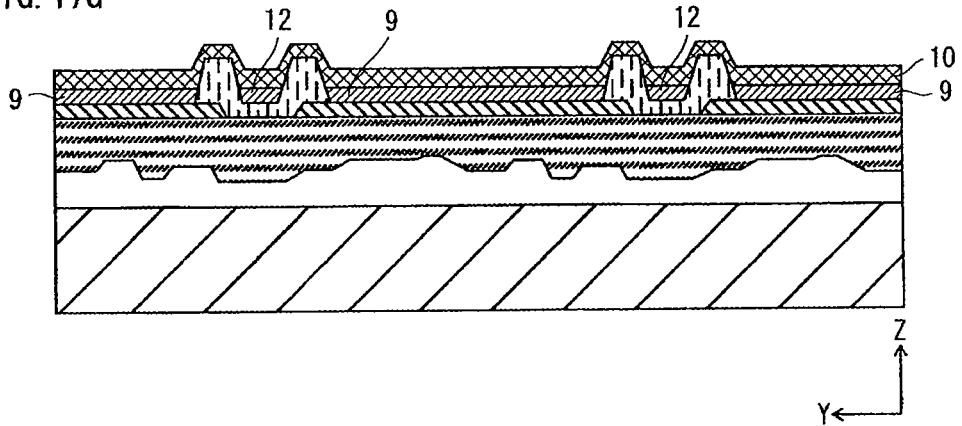

After the light-emitting layer 9 is formed, the upper electrode 10 is formed thereon (FIG. 17G). Once the passivation layer (not illustrated) is overlaid on the upper electrode 10, manufacturing of the organic EL display panel 100B is completed.

It should be noted that in Embodiment 3 also, the light-emitting layer 9 may be disposed on the charge transport layer 9a having a uniform thickness in accordance with the structure and the manufacturing method pertaining to Embodiment 2.

NOTES

The above embodiments have described examples where the inkjet table 20 is used as the work table. However, the present invention is not limited to such examples. By way of example, the ink ejection may be performed in the following manner: after the inkjet head 30 is fixed in position and the ejection target substrate is placed on a table having an XY-plane, the ejection target substrate is relatively moved with respect to the inkjet head 30.

INDUSTRIAL APPLICABILITY

The present invention is applicable as an organic EL element used in a display element (e.g., a display for a mobile phone and a television) and in various types of light sources, an organic EL display panel comprising such an organic EL element, and a manufacturing method for such an organic EL display panel. No matter how the present invention is used, the present invention can provide organic EL elements and organic EL display panels that hardly bring about unevenness in display and therefore achieve excellent light-emitting characteristics as well as image display performance.

What is claimed is:

1. An organic electroluminescence display panel, comprising:
    a substrate;
    a thin-film transistor layer above the substrate;
    a planarizing film above the thin-film transistor layer;
    an electrode layer above the planarizing film;
    a plurality of contact holes in the planarizing film via which a wire is disposed such that the thin-film transistor layer is in electrical contact with the electrode layer; and
    a bank having repellency on at least one surface, the bank being above the electrode layer and having depressions and defining vacancies, each of the depressions being defined by an area of an upper surface of the bank being recessed from surrounding areas of the upper surface, each of the vacancies extending through the bank from the upper surface of the bank to a lower surface of the bank and arranged in rows and columns to define regions for forming organic electroluminescence elements, wherein:
    each of the depressions is located above a corresponding one of the contact holes,
    each of the vacancies is not located above any of the contact holes and does not overlap with any of the depressions,
    a light-emitting layer is within the vacancies,
    a layer including a same organic material as an organic material included in the light-emitting layer is within the depressions, and
    the upper surface of the bank, at bottoms of the depressions, is below a lower surface of the light-emitting layer.

2. The organic electroluminescence display panel of claim 1, wherein a depth of each of the depressions is greater than a height of the bank.

3. The organic electroluminescence display panel of claim 1, wherein a depth of each of the depressions is less than a height of the bank.

4. The organic electroluminescence display panel of claim 1, wherein a depth of each of the depressions is greater than a height of the bank and less than a depth of each of the contact holes.

5. The organic electroluminescence display panel of claim 1, wherein a depth of each of the depressions is equal to a height of the bank.

6. The organic electroluminescence display panel of claim 1, wherein a depth of each of the depressions is determined in accordance with a material of which the bank is composed.

7. The organic electroluminescence display panel of claim 1, wherein portions of the bank are sunken into the contact holes due to a shrinking of a material of which the bank is composed.

8. The organic electroluminescence display panel of claim 1, wherein the contact holes in the planarizing film extend through the planarizing film.

9. The organic electroluminescence display panel of claim 1, wherein the thin-film transistor layer is in direct contact with the electrode layer.

10. The organic electroluminescence display panel of claim 1, wherein a material included in the bank fills the contact holes.

11. The organic electroluminescence display panel of claim 1, wherein the depressions each overlap with a corresponding one of the contact holes.

12. An organic electroluminescence display panel, comprising:
    a substrate;
    a thin-film transistor layer above the substrate;
    a planarizing film above the thin-film transistor layer, the planarizing film having a contact hole disposed therein;
    a first electrode above the planarizing film, the first electrode having a part within the contact hole, the part within the contact hole having a concavity on an upper surface thereof and electrically connecting with the thin-film transistor layer;
    a bank above the first electrode, the bank having a depression and defining a vacancy, the depression being defined by an area an upper surface of the bank being recessed from surrounding areas of the upper surface, the vacancy extending h the bank from the upper surface of the bank to a lower surface of the bank, the depression located above the concavity on the upper surface of the part of the first electrode, the vacancy not located above the concavity on the upper surface of the part of the first electrode and not overlapping with the depression;
    a light-emitting layer including an organic material, the light-emitting layer being formed within the vacancy of the bank;
    a layer including a same organic material as the organic material included in the light-emitting layer, the layer being within the depression on the upper surface of the bank; and
    a second electrode above the light-emitting layer.

* * * * *